United States Patent
Do

(10) Patent No.: US 12,336,330 B2
(45) Date of Patent: Jun. 17, 2025

(54) ULTRA-THIN LED ELEMENT AND INKJET INK AND LIGHT SOURCE INCLUDING THE SAME

(71) Applicant: KOOKMIN UNIVERSITY INDUSTRY ACADEMY COOPERATION FOUNDATION, Seoul (KR)

(72) Inventor: Young Rag Do, Seoul (KR)

(73) Assignee: KOOKMIN UNIVERSITY INDUSTRY ACADEMY COOPERATION FOUNDATION, Seoul (KR)

(*) Notice: Subject to any disclaimer, the term of this patent is extended or adjusted under 35 U.S.C. 154(b) by 629 days.

(21) Appl. No.: 17/563,333

(22) Filed: Dec. 28, 2021

(65) Prior Publication Data

US 2022/0209063 A1 Jun. 30, 2022

(30) Foreign Application Priority Data

Dec. 31, 2020 (KR) .................. 10-2020-0189203

(51) Int. Cl.
*H10H 20/819* (2025.01)
*H10H 20/816* (2025.01)
*H10H 20/831* (2025.01)

(52) U.S. Cl.
CPC ........ *H10H 20/819* (2025.01); *H10H 20/816* (2025.01); *H10H 20/831* (2025.01)

(58) Field of Classification Search
CPC ......... H01L 33/20; H01L 33/14; H01L 33/38; H10H 20/819; H10H 20/831; H10H 20/816
See application file for complete search history.

(56) References Cited

U.S. PATENT DOCUMENTS

| | | | |
|---|---|---|---|
| 2019/0333903 A1 | 10/2019 | Brodoceanu et al. | |
| 2020/0388723 A1 | 12/2020 | Ahmed et al. | |
| 2022/0077356 A1* | 3/2022 | Do ........................ | H01L 33/505 |

FOREIGN PATENT DOCUMENTS

| | | |
|---|---|---|
| KR | 101436123 | 11/2014 |
| KR | 20150006798 | 1/2015 |
| KR | 20150021613 | 3/2015 |
| KR | 10-2018-0095709 | 8/2018 |
| KR | 20190117413 | 10/2019 |
| KR | 20200011302 | 2/2020 |
| KR | 20200021014 | 2/2020 |
| TW | I541992 | 7/2016 |
| WO | WO 2018/121611 | 7/2018 |

OTHER PUBLICATIONS

Office Action issued in Corresponding Korean Application No. 10-2020-0189203, dated Mar. 30, 2022 (No English Translation provided).

* cited by examiner

*Primary Examiner* — Richard A Booth
(74) *Attorney, Agent, or Firm* — NORTON ROSE FULBRIGHT US LLP

(57) ABSTRACT

The present invention relates to a light-emitting diode (LED) element, and more particularly, to an ultra-thin LED element, and inkjet ink and a light source including the same.

15 Claims, 15 Drawing Sheets

ULTRA-THIN LED ELEMENT AND INKJET INK AND LIGHT SOURCE INCLUDING THE SAME

CROSS-REFERENCE TO RELATED APPLICATION

This application claims priority to and the benefit of Korean Patent Application No. 10-2020-0189203, filed on Dec. 31, 2020, the disclosure of which is incorporated herein by reference in its entirety.

BACKGROUND

1. Field of the Invention

The present invention relates to a light-emitting diode (LED) element, and more particularly, to an ultra-thin LED element, and inkjet ink and a light source including the same.

2. Discussion of Related Art

Micro-light-emitting diodes (LEDs) and nano-LEDs may implement an excellent feeling of color and high efficiency and may be eco-friendly materials, thereby being used as core materials for displays. In line with such market conditions, recently, research for developing new nanorod LED structures or shell-coated nano-cable LEDs through new manufacturing processes is being carried. In addition, research on a protective film material is being carried out to achieve high efficiency and high stability of a protective film covering an outer surface of nanorods, and research and development of a ligand material advantageous for a subsequent process is also being carried out.

Recently, large-sized red, green, and blue micro-LED display televisions (TVs) have been commercialized in line with research in such material fields, and in the future, TVs, which implement full-color through blue subpixels implemented using blue micro-LEDs or nano-LEDs and red and green subpixels implemented using quantum dots emitting light through the blue LEDs, will be commercialized. In addition, red, green, and blue nano-LED display TVs will also be commercialized.

Micro-LED displays have advantages such as high performance characteristics, very long theoretical lifetime, and very high efficiency, but when micro-LED displays are developed as displays with 8K resolution, a red micro-LED, a green micro-LED, and a blue micro-LED should be put in one-to-one correspondence with each of nearly 100 million subpixels. Thus, through pick and place technology for manufacturing micro-LED displays, it is difficult to manufacture true high-resolution commercial displays ranging from smartphones to TVs due to the limitations of process technology, considering a high unit price, a high process defect rate, and low productivity. In addition, it is more difficult to individually arrange nano-LEDs on subpixels using pick and place technology for micro-LEDs.

In order to overcome such difficulty, Korean Patent Publication No. 10-1436123 discloses a display manufactured through a method of dropping a solution mixed with nanorod-type LEDs on subpixels and then forming an electric field between two alignment electrodes to self-align nanorod-type LED elements on the electrodes and form the subpixels.

However, in the disclosed technology, since the LED elements are aligned through an electric field, the LED elements should have a rod-like shape that is formed to be elongated in one direction and has a large aspect ratio. Thus, the LED elements are easily precipitated in a solvent and thus are difficult to form into ink. In addition, since the elements lie down to be assembled on the electrodes, that is, are assembled to be parallel to a stack direction of each semiconductor layer in the element, an area from which light is extracted is small, which causes a problem in that efficiency is not high.

Specifically, a method is known in which a nanopatterning process in combination with dry etching/wet etching are performed on an LED wafer to manufacture nanorod-type LED elements in a top-down manner, or nanorod-type LED elements are grown directly on a substrate in a bottom-up manner. In such nanorod-type LEDs, since a major axis of an LED coincides with a stack direction, that is, a stack direction of each layer in a p-GaN/InGaN multi-quantum well (MQW)/n-GaN stacked structure, an emission area is narrow. Since the emission area is narrow, surface defects have a relatively large effect on a decrease in efficiency, and it is difficult to optimize an electron-hole recombination rate, which may cause a problem in that luminous efficiency is significantly lower than that of the original wafer.

Therefore, there is an urgent need to develop a new LED material that is suitable for ink formation, has a wide emission area, minimizes or prevents a decrease in efficiency due to surface defects, and has an optimized electron-hole recombination rate.

SUMMARY OF THE INVENTION

The present invention is directed to providing an ultra-thin light-emitting diode (LED) element which is suitable for ink formation, has a wide emission area, minimizes or prevents a decrease in efficiency due to surface defects, and has an optimized electron-hole recombination rate, inkjet ink, and a light source including the same.

According to an aspect of the present invention, there is provided an ultra-thin LED element at least including a first conductive semiconductor layer, a photoactive layer, and a second conductive semiconductor layer, wherein a ratio between a thickness in a stack direction of layers and a length of a major axis in a cross section perpendicular to the stack direction is in a range of 1:0.5 to 1:1.5.

One of the first conductive semiconductor layer and the second conductive semiconductor layer may be an n-type III-nitride semiconductor layer, and the other one thereof may be a p-type III-nitride semiconductor layer.

The ultra-thin LED element may have a maximum surface area of 16 μm² or less.

The ultra-thin LED element may have a thickness of 2.7 μm or less, more preferably a thickness of 2.0 μm or less, and yet more preferably 0.2 to 1.0 μm.

The first conductive semiconductor layer may be an n-type III-nitride semiconductor layer, and the ultra-thin LED element may further include an electron delay layer below the first conductive semiconductor layer such that the numbers of electrons and holes recombined in the photoactive layer are balanced.

The electron delay layer may include at least one selected from the group consisting of CdS, GaS, ZnS, CdSe, CaSe, ZnSe, CdTe, GaTe, SiC, ZnO, ZnMgO, SnO₂, TiO₂, In₂O₃, Ga₂O₃, silicon (Si), polyparaphenylene vinylene, derivatives thereof, polyaniline, poly(3-alkylthiophene), and poly(paraphenylene).

The first conductive semiconductor layer may be a doped n-type III-nitride semiconductor layer, and the electron delay layer may be a III-nitride semiconductor having a lower doping concentration than the first conductive semiconductor layer.

The ultra-thin LED element may further include a protective film configured to surround an exposed side surface of the ultra-thin LED element.

The first conductive semiconductor layer may be an n-type III-nitride semiconductor layer, the second conductive semiconductor layer may be a p-type III-nitride semiconductor layer, and the ultra-thin LED element may further include at least any one film of a hole pushing film configured to surround an exposed side surface of the second conductive semiconductor layer or the exposed side surface of the second conductive semiconductor layer and an exposed side surface of at least a portion of the photoactive layer and move holes at a surface side of the exposed side surface toward a center, and an electron pushing film configured to surround an exposed side surface of the first conductive semiconductor layer and move electrons at a surface side of the exposed side surface toward a center.

The ultra-thin LED element may include both the hole pushing film and the electron pushing film, wherein the electron pushing film is provided as an outermost film configured to surround side surfaces of the first conductive semiconductor layer, the photoactive layer, and the second conductive semiconductor layer.

The hole pushing film may include at least one selected from the group consisting of $AlN_x$, $ZrO_2$, $MoO$, $Sc_2O_3$, $La_2O_3$, $MgO$, $Y_2O_3$, $Al_2O_3$, $Ga_2O_3$, $TiO_2$, $ZnS$, $Ta_2O_5$, and n-$MoS_2$.

The electron pushing film may include at least one selected from the group consisting of $Al_2O_3$, $HfO_2$, $SiN_x$, $SiO_2$, $ZrO_2$, $Sc_2O_3$, $AlN_x$, and $Ga_2O_3$.

The ultra-thin LED element may further include a second electrode layer provided on the first conductive semiconductor layer and a first electrode layer provided on the second conductive semiconductor layer.

The ultra-thin LED element may further include a selective bonding layer configured to erect and assemble the ultra-thin LED element in a thickness direction thereof at a desired position of a driving electrode on an uppermost layer or a lowermost layer of the ultra-thin LED element, wherein the selective bonding layer is a magnetic layer or a chemical bond inducing layer.

According to another aspect of the present invention, there is provided an ink composition for inkjet including a plurality of ultra-thin LED elements according to the present invention.

According to still another aspect of the present invention, there is provided a light source that is equipped with an ultra-thin LED element according to the present invention.

Hereinafter, the terms used in the present invention will be defined.

In descriptions of embodiments of the present invention, it should be understood that when a layer, region, or pattern is referred to as being "on," "above," "under," or "below" a substrate, another layer, another region, or another pattern, the terminology of "on," "above," "under," or "below" includes both the meanings of "directly" and "indirectly" "on," "above," "under," or "below."

The present invention has been researched under support of National Research and Development Project, and specific information of National Research and Development Project is as follow:

[Project Series Number] 1711105790
[Project Number] 2016R1A5A1012966
[Government Department Name] Ministry of Science and ICT
[Project Management Authority Name] National Research Foundation of Korea
[Research Program Name] Science and Engineering Research Center (S/ERC)
[Research Project Name] Circadian ICT research center using hybrid device
[Project Execution Organization Name] Kookmin University Industry Academic Cooperation Foundation
[Period of Research] Jan. 1, to Dec. 31, 2021
[Project Series Number] 1415174040
[Project Number] 20016290
[Government Department Name] Ministry of Trade, Industry and Energy
[Project Management Authority Name] Korea Evaluation Institute of Industrial Technology
[Research Program Name] Electronic Components Industry Technology Development-Super Large Micro-LED Modular Display
[Research Project Name] Development of sub-micron blue light-emitting source technology for modular display
[Project Execution Organization Name] Kookmin University Industry Academic Cooperation Foundation
[Period of Research] Apr. 1, 2021 to Dec. 31, 2024.

DETAILED DESCRIPTION OF EXEMPLARY EMBODIMENTS

Hereinafter, embodiments of the present invention will be described in detail with reference to the accompanying drawings such that those skilled in the art to which the present invention can easily carry out the present invention. It should be understood that the present invention may be embodied in various different forms and is not limited to the following embodiments.

Figure 1:
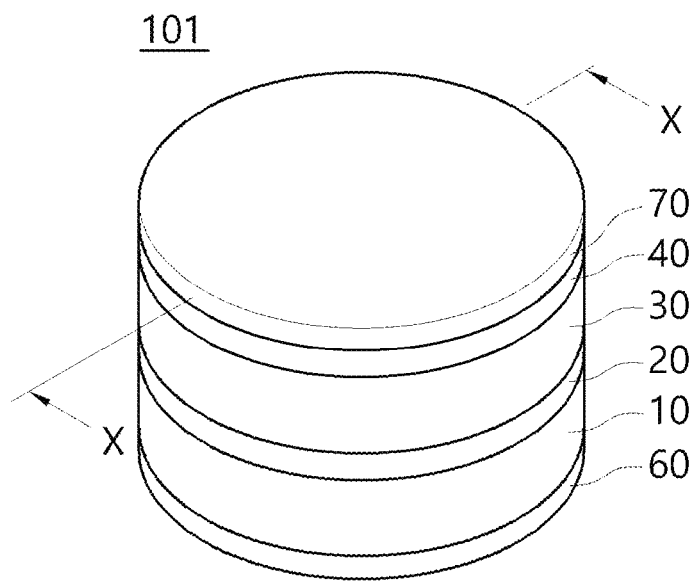
FIG. 1 is a perspective view of an ultra-thin light-emitting diode (LED) element according to one embodiment of the present invention.
Figure 2:
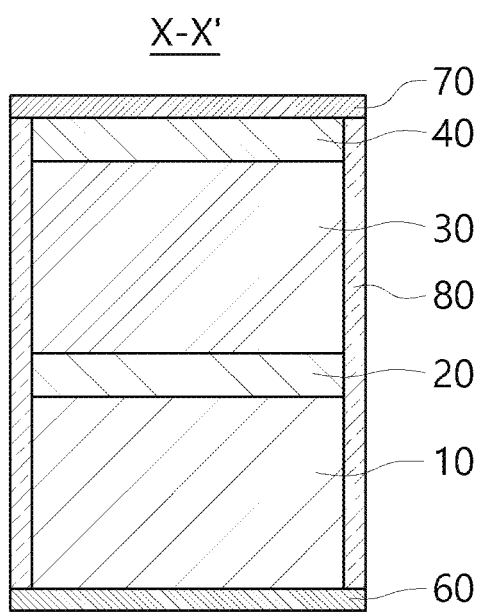
FIG. 2 is a cross-sectional view taken along line X-X' of FIG. 1.

Referring to FIGS. 1 and 2, an ultra-thin light-emitting diode (LED) element 101 according to the present invention may include a first conductive semiconductor layer 10, a photoactive layer 20, and a second conductive semiconductor layer 30 and may further include a second electrode layer 60 formed below the first conductive semiconductor layer 10, a first electrode layer 40 formed on the second conductive semiconductor layer 30, and a selective bonding layer formed on the first electrode layer.

The above-described layers may be stacked in any one direction, and a ratio between a thickness in a stack direction and a length of a major axis in a cross section perpendicular to the stack direction may satisfy a ratio in a range of 1:0.5 to 1:1.5, preferably a range of 1:0.8 to 1:1.2, and more preferably a range of 1:0.9 to 1:1.1. Thus, when the ultra-thin LED element is implemented with inkjet ink, the ultra-thin LED element can exhibit excellent dispersibility in a dispersion medium and can be advantageous in maintaining a dispersed state without precipitation for a long time. In addition, due to a geometrical structure suitable for ink formation, there is no need for a separate additive for maintaining a dispersed state, and thus, there is an advantage in that contamination of a driving electrode or a circuit board due to the separate additive can be prevented in advance. Furthermore, when ink including ultra-thin LED elements is printed on a driving electrode, most conventional nanorod-type LED elements with a large aspect ratio lie down to be positioned on the driving electrode, and the ultra-thin LED element has an advantage of reducing the probability of the LED element lying down to be positioned on the driving electrode. In addition, it is possible to reduce the probability that a plurality of elements are assembled in different directions when assembled on a driving electrode in a thickness direction thereof, in other words, the probability that a p-type conductive semiconductor layer and an n-type conductive semiconductor layer are assembled in different directions, thereby reducing an electric leak due to a reverse arrangement to improve a lifetime thereof. Here, a length of a major axis refers to a diameter when a shape of a cross section is a circular shape, a length of a major axis when a shape of a cross section is an elliptic shape, or a length of the longest side when a shape of a cross section is a polygonal shape. Meanwhile, when cross-sections of the ultra-thin LED element are not the same in a thickness direction thereof, the cross-section refers to the largest surface of the cross-sections.

In addition, a ratio between a length of a minor axis and the length of the major axis in the cross section may also satisfy a ratio in a range of 1:0.5 to 1:1.5, preferably a range of 1:0.8 to 1:1.2, and more preferably a range of 1:0.9 to 1:1.1, and thus, it may be more advantageous in achieving the above-described objects of the present invention. Even though the ratio between the thickness and the length of the major axis satisfies a ratio in a range of 1:0.5 to 1:1.5, when the ratio between the length of the minor axis and the length of the major axis in the cross section deviates from a range of 1:0.5 to 1:1.5, it may be difficult for the LED element to remain dispersed in the dispersion medium for a long time, and thus, the LED element may be unsuitable for being formed into ink. In addition, in order for an LED element having a geometrical structure unsuitable for such ink formation to remain dispersed in a dispersion medium for a long time, it is necessary to further add an additive, and thus, there is a risk of contaminating a driving electrode or circuit board due to the use of the additive.

Meanwhile, although, in the ultra-thin LED element 101 shown in FIG. 1, cross sections of layers perpendicular to the stack direction are illustrated as having the same size, the present invention is not limited thereto, and the cross sections may have different sizes according to thicknesses.

In addition, a shape of the ultra-thin LED element 101 may be a cylindrical shape as shown in FIG. 1 but is not limited thereto, and the ultra-thin LED element 101 may have not only a polyhedral shape such as a hexahedral shape, an octahedral shape, or a decahedral shape but also an atypical shape having a star-shaped surface.

According to one embodiment of the present invention, due to a slow sedimentation rate during ink formation, the ultra-thin LED element 101 has excellent dispersion retention performance capable of continuously maintaining a dispersed state, and thus, the ultra-thin LED element 101 may have a maximum surface area of 16 $\mu m^2$ or less, more preferably a maximum surface area of 9 $\mu m^2$ or less, still more preferably a maximum surface area of 4 $\mu m^2$ or less, and yet more preferably a maximum surface area of 0.1 $\mu m^2$ to 2.5 $\mu m^2$. Here, the maximum surface area refers to a maximum value among areas of a vertical projection surface for the ultra-thin LED element. When the maximum surface area exceeds 16 $\mu m^2$, a sedimentation rate is high, and thus, there may be limitations in that dispersion retention performance is likely to be degraded, the ultra-thin LED element 101 is unsuitable for being manufactured with ink, or a separate additive should be further added or a dispersion medium should be used as a specific one in order for ink formation.

According to one embodiment of the present invention, the ultra-thin LED element 101 may have a thickness of 2.7 $\mu m$ or less, more preferably a thickness of 2.0 $\mu m$ or less, and yet more preferably 0.2 to 1.0 $\mu m$, which may be more suitable for maintaining a dispersed state for a long time during ink formation.

However, in the case of an LED element, when a thickness thereof is implemented to be thin, a position at which electrons and holes are combined deviates from the photoactive layer 20, thereby resulting in a decrease in luminous efficiency. In particular, when a large-area LED wafer is etched to implement the ultra-thin LED elements, thicknesses of the first conductive semiconductor layer, the photoactive layer, and the second conductive semiconductor layer are already determined in a state of the LED wafer, and only portions thereof are etched to a thickness different from that of the wafer and implemented as the ultra-thin LED element. Thus, such a problem inevitably occurs. Such a change in position at which electrons and holes are combined is caused due to a difference in velocity between electrons and holes moving in conductive semiconductor layers, and for example, in an n-type GaN conductive semiconductor layer, electrons have a mobility of 200 cm$^2$/Vs, and in a p-type GaN conductive semiconductor layer, holes have a mobility of only 5 cm$^2$/Vs.

Thus, due to such an electron-hole velocity imbalance, a position at which electrons and holes are combined may be changed according to a thickness of the p-type GaN conductive semiconductor layer and a thickness of the n-type GaN conductive semiconductor layer and may deviate from a photoactive layer.

Figure 4:
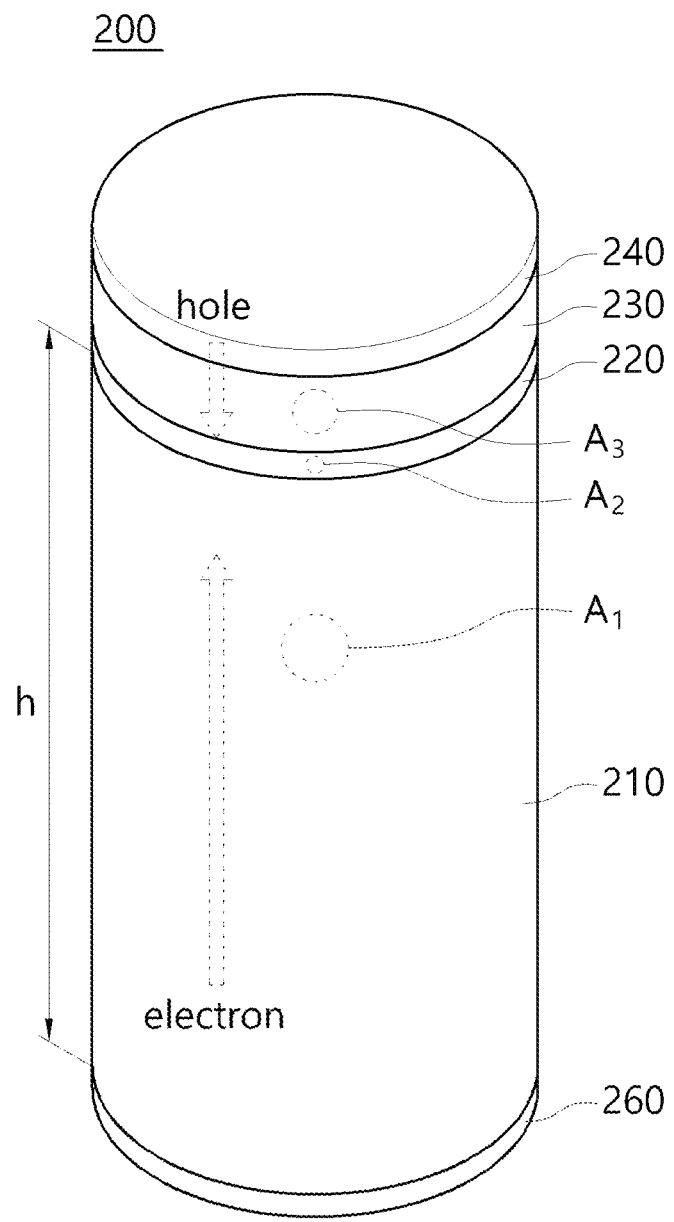
FIG. 4 is a schematic view for describing a balance between electrons and holes in an LED element.

Describing this with reference to FIG. 4, in an LED element 200 having a diameter of about 600 nm in which an n-type GaN conductive semiconductor layer 210, a photoactive layer 220, and a p-type GaN conductive semiconductor layer 230 are stacked, in consideration of electron mobility of the n-type GaN conductive semiconductor layer 210 and hole mobility of the p-type GaN conductive semiconductor layer 230, when a thickness is designed to balance the numbers of electrons and holes recombined at a point $A_2$ in the photoactive layer 220, a thickness h of the n-type GaN conductive semiconductor layer 210 inevitably needs to be thick, and thus, unless a thickness of the p-type GaN-conductive semiconductor layer 230 is implemented to be very thin, the LED element is very likely to be implemented as a rod-type LED element having a long length in a thickness direction thereof. In other words, in the case of an LED element in which a thickness of each layer is designed such that a position at which the numbers of electrons and holes are recombined are balanced is in the photoactive layer 220, although a length of a major axis in a cross section perpendicular to a thickness direction can be implemented to be short, since it is difficult to decrease a thickness of the LED element so as to be less than or equal to a certain level, as a result, a rod-type LED element formed to be elongated in a thickness direction of the LED element is inevitably implemented. Thus, even when the numbers of holes and electrons recombined in the photoactive layer are balanced, it may be inappropriate to implement the LED element with ink. In addition, when the thickness of the n-type GaN conductive semiconductor layer 210 is implemented to be thin so as to be suitable for implementation with ink, as a position at which the numbers of recombined electrons and holes are balanced is shifted from the photoactive layer 220 to a certain point $A_3$ in the p-type GaN conductive semiconductor layer 230, luminous efficiency may be degraded.

Accordingly, an ultra-thin LED element according to one embodiment of the present invention may have a geometric structure suitable for being implemented with ink and also may further include an electron delay layer adjacent to an n-type conductive semiconductor layer so as to balance the numbers of holes and electrons recombined in a photoactive layer to prevent a degradation in luminous efficiency. Describing this with reference to FIG. 5, when a first conductive semiconductor layer is an n-type conductive semiconductor, an ultra-thin LED element 102 may include an electron delay layer 50 below a first conductive semiconductor layer 10. Accordingly, even when a thickness of the first conductive semiconductor layer 10 is implemented to be thin, it is possible to prevent a degradation in luminous efficiency. In addition, the decreased thickness of the first conductive semiconductor layer 10 may decrease the probability that electrons are captured by surface defects while moving in a thickness direction of the first conductive semiconductor layer 10, thereby minimizing emission loss.

The electron delay layer 50 may include, for example, at least one selected from the group consisting of CdS, GaS, ZnS, CdSe, CaSe, ZnSe, CdTe, GaTe, SiC, ZnO, ZnMgO, SnO$_2$, TiO$_2$, In$_2$O$_3$, Ga$_2$O$_3$, silicon (Si), polyparaphenylene vinylene, derivatives thereof, polyaniline, poly(3-alkylthiophene), and poly(paraphenylene). In addition, as another example, when the first conductive semiconductor layer 10 is a doped n-type III-nitride semiconductor layer, the electron delay layer 50 has a III-nitride semiconductor having a lower doping concentration than the first conductive semiconductor layer 10.

The thickness of the electron delay layer 50 may be in a range of 1 nm to 100 nm but is not limited thereto, and the thickness of the electron delay layer 50 may be appropriately changed in consideration of a material of an n-type conductive semiconductor layer, a material of the electron delay layer, and the like.

Hereinafter, each layer of the ultra-thin LED element 101 or 102 according to one embodiment of the present invention will be described in detail.

Any one of the first conductive semiconductor layer 10 and the second conductive semiconductor layer 30 may be an n-type semiconductor layer, and the other one thereof may be a p-type semiconductor layer. A known semiconductor layer applied to an LED may be used as the n-type semiconductor layer and the p-type semiconductor layer without limitation. As an example, the n-type semiconductor layer and the p-type semiconductor layer may include Group III-V semiconductors referred to as III-nitride materials, in particular binary, ternary, and quaternary alloys of gallium, aluminum, indium, and nitrogen.

As an example, the first conductive semiconductor layer 10 may be an n-type semiconductor layer. In this case, the n-type semiconductor layer may include a semiconductor material having an empirical formula of In$_x$Al$_y$Ga$_{1-x-y}$N ($0 \leq x \leq 1$, $0 \leq y \leq 1$, and $0 \leq x+y \leq 1$), for example, at least one selected from among InAlGaN, GaN, AlGaN, InGaN, AN, InN, and the like and may be doped with a first conductive dopant (for example, Si, germanium (Ge), or tin (Sn)). According to one exemplary embodiment of the present invention, the first conductive semiconductor layer 10 may have a thickness of 100 nm to 1,800 nm, but the present invention is not limited thereto.

In addition, the second conductive semiconductor layer 30 may be a p-type semiconductor layer. In this case, the p-type semiconductor layer may include a semiconductor material having an empirical formula of In$_x$Al$_y$Ga$_{1-x-y}$N ($0 \leq x \leq 1$, $0 \leq y \leq 1$, and $0 \leq x+y \leq 1$), for example, at least one selected from among InAlGaN, GaN, AlGaN, InGaN, AlN, and InN, and the like, and may be doped with a second conductive dopant (for example, magnesium (Mg)). According to one exemplary embodiment of the present invention, the second conductive semiconductor layer 30 may have a thickness of 50 nm to 150 nm, but the present invention is not limited thereto In addition, the photoactive layer 20 positioned between the first conductive semiconductor layer 10 and the second conductive semiconductor layer 30 may be formed to have a single or multi-quantum well structure. A photoactive layer included in a typical LED element used for a light, a display, and the like may be used as the photoactive layer 20 without limitation. A clad layer (not shown) doped with a conductive dopant may be formed on and/or below the photoactive layer 20, and the clad layer doped with the conductive dopant may be implemented as an AlGaN layer or an InAlGaN layer. In addition, a material such as AlGaN or AlInGaN may be used for the photoactive layer 20. In the photoactive layer 20, when an electric field is applied to an element, electrons and holes moving from the conductive semiconductor layers positioned on and below the photoactive layer to the photoactive layer are combined to generate electron-hole pairs in the photoactive layer, thereby emitting light. According to one exemplary embodiment of the present invention, the photoactive layer 20 may have a thickness of 50 nm to 200 nm, but the present invention is not limited thereto.

Meanwhile, the second electrode layer 60 may be provided below the first conductive semiconductor layer 10. Alternatively, the electron delay layer 50 may be further provided between the first conductive semiconductor layer 10 and the second electrode layer 60. In addition, the first electrode layer 40 may be provided on the second conductive semiconductor layer 30.

Figure 5:
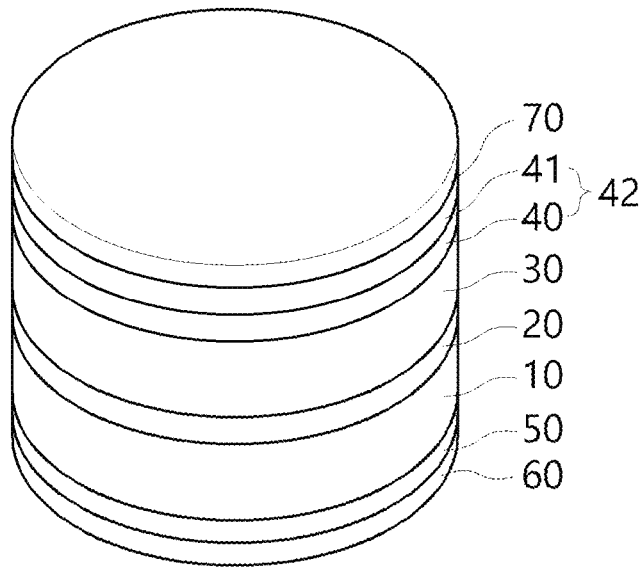
FIG. 5 is a perspective view of an ultra-thin LED element according to one embodiment of the present invention.

An electrode layer included in a typical LED element used for a light, a display, and the like may be used as the first electrode layer 40 and the second electrode layer 60 without limitation. The first electrode layer 40 and the second electrode layer 60 are each independently a single layer made of one selected from among chromium (Cr), titanium (Ti), aluminum (Al), gold (Au), nickel (Ni), indium tin oxide (ITO), and oxides or alloys thereof, a single layer made of two or more thereof, or a composite layer in which two or more materials thereof each constitute a layer. As an example, as shown in FIG. 5, the ultra-thin LED element 102 may include a first electrode composite layer 42 in which the first electrode layer 40, which is an ITO layer, and a Ti/Au composite layer 41 are stacked on the second conductive semiconductor layer 30. In addition, the first electrode layer 40 and the second electrode layer 60 may each independently have a thickness of 10 nm to 500 nm, but the present invention is not limited thereto.

Figure 3A:
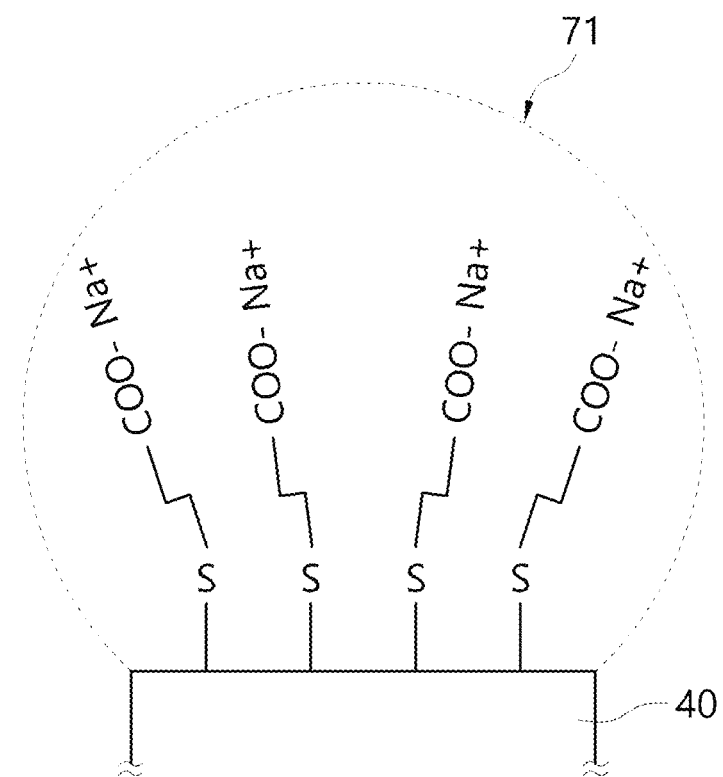
FIG. 3A to 3C are views of various examples of a selective bonding layer that may be provided in an ultra-thin LED element according to one embodiment of the present invention.
Figure 3B:
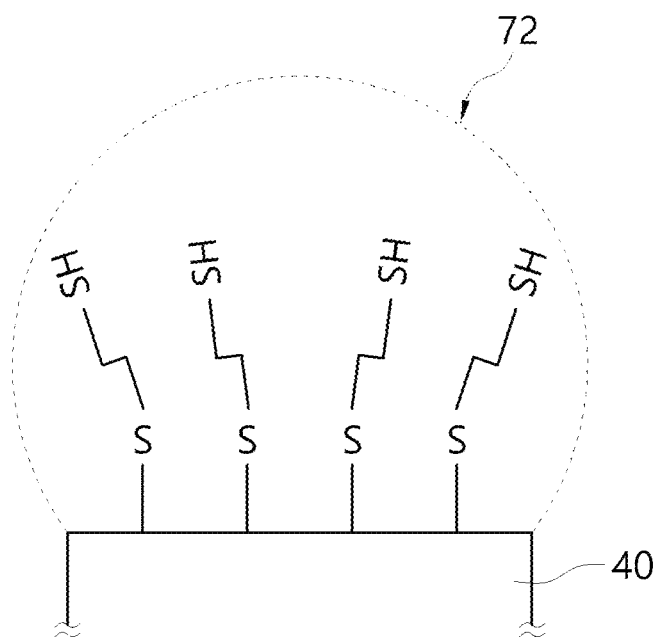
Figure 3C:
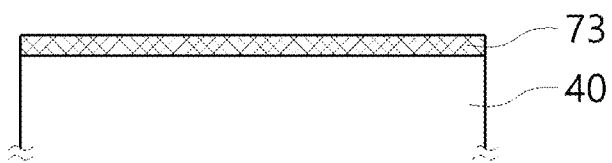

In addition, a selective bonding layer 70 may be further disposed on the first electrode layer 40 or 42. The selective bonding layer 70 performs a function of assembling the ultra-thin LED element at a desired position of a driving electrode thereon. The material of the selective bonding layer 70 may be changed according to a specific bonding method. For example, the selective bonding layer 70 may be a chemical bond inducing layer, and specifically, as shown in FIG. 3A, a selective bonding layer 71 may be an ionic bond inducing layer and may be assembled with a bond inducing layer having an opposite charge on a driving electrode through an ionic bond. In addition, as shown in FIG. 3B, a selective bonding layer 72 may be a covalent bond inducing layer and may be assembled with a covalent bond inducing layer, which has a functional group capable of covalent-bonding with a provided another functional group, on a driving electrode through a covalent bond. In addition, the selective bonding layer 70 may be a magnetic layer 73 as shown in FIG. 3C, and the magnetic layer 73 may be assembled on a driving electrode using magnetic properties.

Meanwhile, although the selective bonding layer 70 is illustrated in FIGS. 1 and 2 as being positioned on the second electrode layer 60, the present invention is not limited thereto, and the selective bonding layer 70 may be disposed to be positioned on the first electrode layer 40. In other words, the selective bonding layer 70 may be provided in the ultra-thin LED element so as to be an uppermost layer or a lowermost layer of the ultra-thin LED element.

In addition, when a surface parallel to the stack direction refers to a side surface, the ultra-thin LED element 101 may further include a protective film 80 surrounding the side surface of the element. The protective film 80 performs a function of protecting surfaces of the first conductive semiconductor layer 10, the photoactive layer 20, and the second conductive semiconductor layer 30. In addition, as in one manufacturing method to be described below, in a process of etching an LED wafer in a thickness direction thereof and then separating a plurality of LED pillars, the protective film 80 may perform a function of protecting the first conductive semiconductor layer 10. The protective film 80 may include, for example, at least one selected from among silicon nitride ($Si_3N_4$), silicon dioxide ($SiO_2$), aluminum oxide ($Al_2O_3$), hafnium oxide ($HfO_2$), zirconium oxide ($ZrO_2$), yttrium oxide ($Y_2O_3$), titanium dioxide ($TiO_2$), aluminum nitride (AlN), and gallium nitride (GaN). The protective film 80 may have a thickness of 5 nm to 100 nm and more preferably a thickness of 30 nm to 100 nm, which may be advantageous in protecting the first conductive semiconductor layer 10 in the process of separating the LED pillars to be described below.

Figure 6:
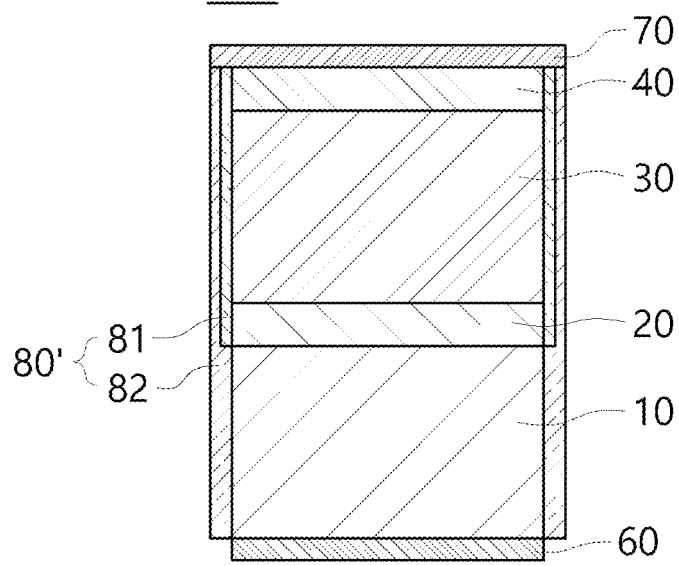
FIG. 6 is a cross-sectional view of an ultra-thin LED element according to one embodiment of the present invention.

Meanwhile, as shown in FIG. 6, an ultra-thin LED element 103 according to one embodiment of the present invention may include a protective film 80' which includes a hole pushing film configured to surround an exposed side surface of a second conductive semiconductor layer 30 or the exposed side surface of the second conductive semiconductor layer 30 and an exposed side surface of at least a portion of a photoactive layer 20 and move holes at a surface side of the exposed side surface toward a center, and an electron pushing film 82 configured to surround an exposed side surface of a first conductive semiconductor layer 10 and move electrons at a surface side of the exposed side surface toward a center in order to have a protection function as a protective film and also have more improved luminous efficiency.

Some of electric charges moving from the first conductive semiconductor layer 10 to the photoactive layer 20 and some of holes moving from the second conductive semiconductor layer 30 to the photoactive layer 20 may move along a surface of a side surface, and in this case, quenching of electrons or holes may occur due to defects present on the surface, which may cause a risk in which luminous efficiency is degraded. In this case, even when a protective film is provided, there is a problem in that quenching is unavoidable due to defects occurring on an element surface before the protective film is provided. However, when the protective film 80' includes the hole pushing film 81 and the electron pushing film 82, electrons and holes may be concentrated toward an element center and guided to move in a direction of the photoactive layer, and thus, even when defects are present on the element surface before the protective film is formed, there is an advantage in that loss of luminous efficiency due to surface defects can be prevented.

The hole pushing film 81 may include, for example, at least one selected from the group consisting of $AlN_x$, $ZrO_2$, MoO, $Sc_2O_3$, $La_2O_3$, MgO, $Y_2O_3$, $Al_2O_3$, $Ga_2O_3$, $TiO_2$, ZnS, $Ta_2O_5$, and n-$MoS_2$, and the electron pushing film 82 may include at least one selected from the group consisting of $Al_2O_3$, $HfO_2$, $SiN_x$, $SiO_2$, $ZrO_2$, $Sc_2O_3$, $AlN_x$, and $Ga_2O_3$.

In addition, as shown in FIG. 6, when the ultra-thin LED element includes both the hole pushing film 81 and the electron pushing film 82, the electron pushing film 82 may be provided as an outermost film surrounding side surfaces of the first conductive semiconductor layer 10, the photoactive layer 20, and the second conductive semiconductor layer 30.

Furthermore, the hole pushing film 81 and the electron pushing film 82 may each independently have a thickness of 1 nm to 50 nm.

Meanwhile, the first conductive semiconductor layer 10, the photoactive layer 20, and the second conductive semiconductor layer 30 may be included as minimum components of the ultra-thin LED element, and another phosphor layer, quantum dot layer, active layer, semiconductor layer, hole block layer, and/or electrode layer may be further included on/below each layer.

Figure 7:
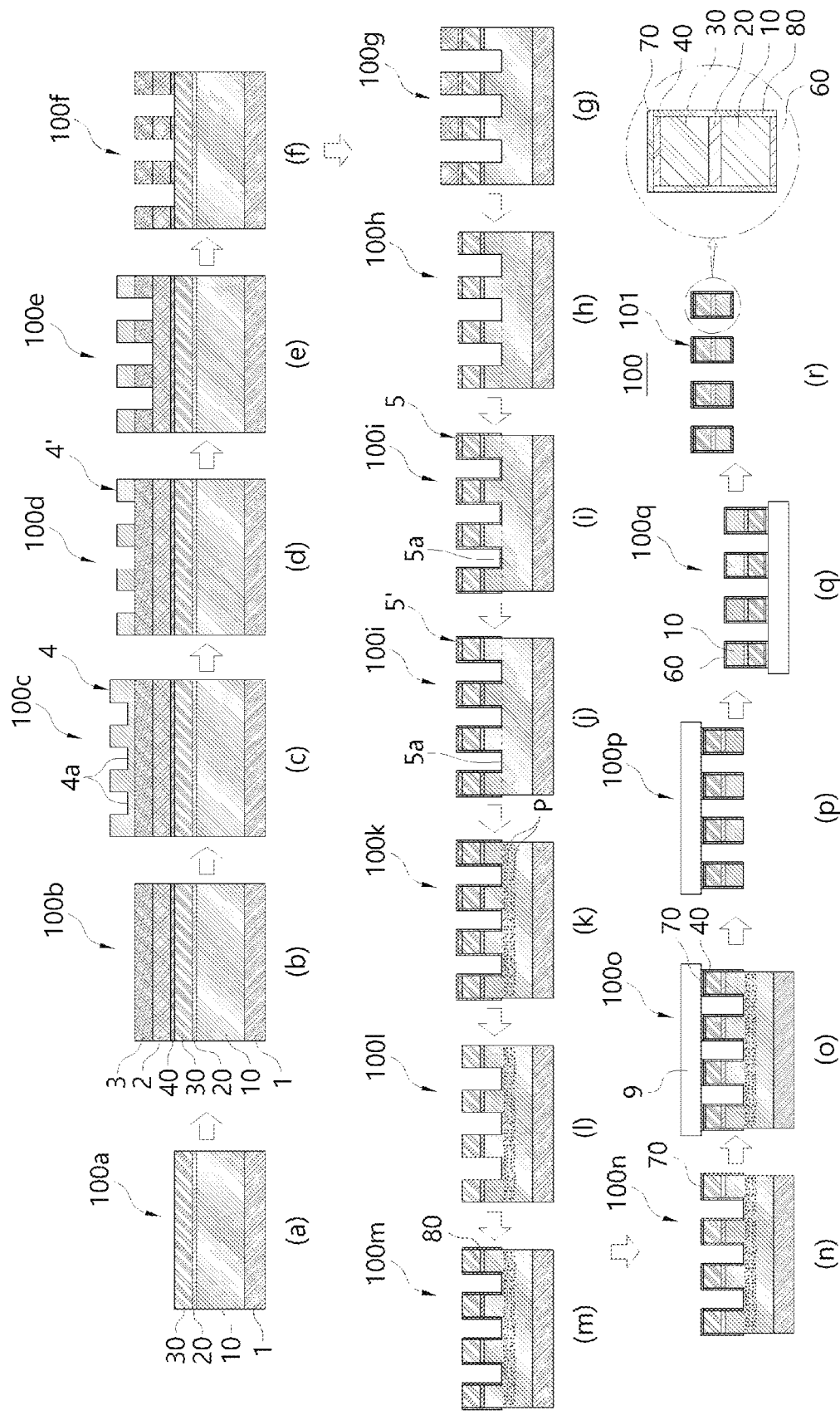
FIG. 7 shows schematic views of Manufacturing Method 1 of an ultra-thin LED element according to one embodiment of the present invention.
Figure 10:
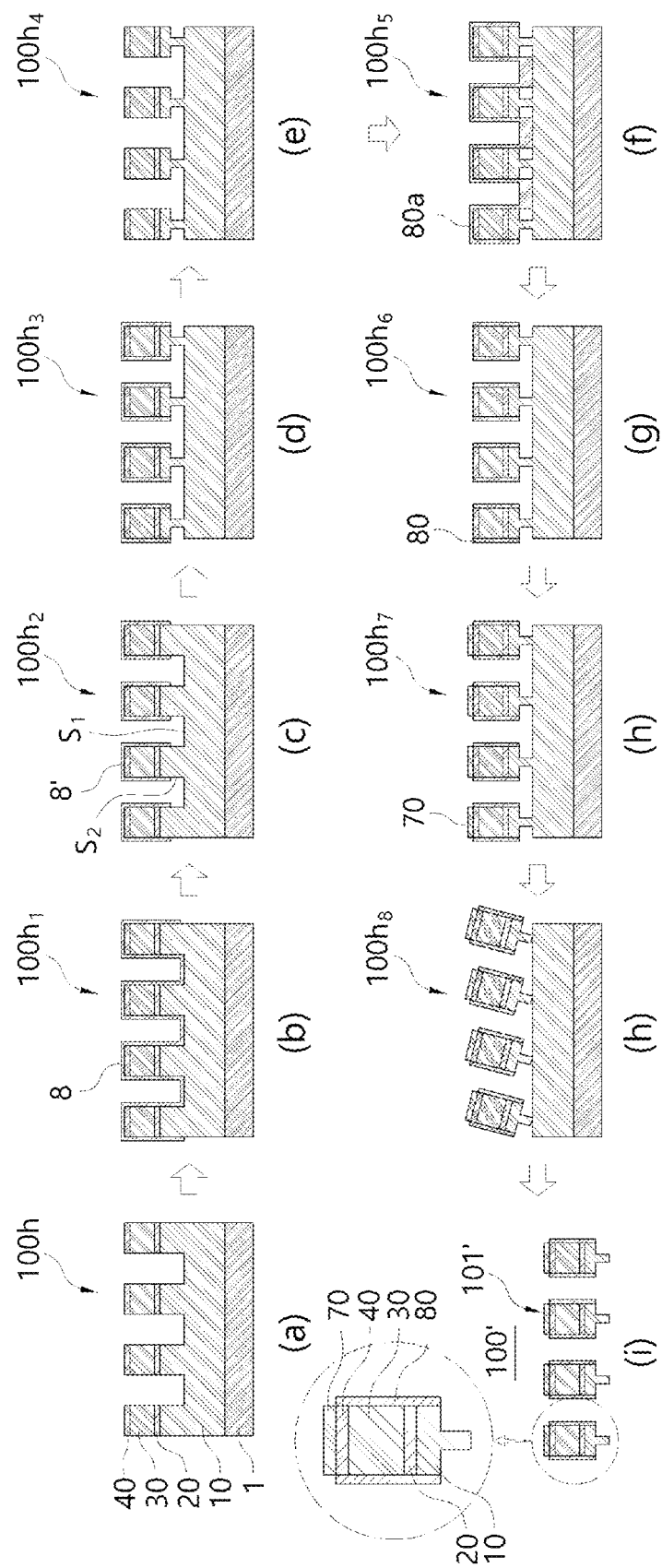
FIG. 10 shows schematic views of Manufacturing Method 2 of an ultra-thin LED element according to one embodiment of the present invention.

An ultra-thin film LED element aggregate 100 including the ultra-thin film LED element 101 according to one embodiment of the present invention described above may be manufactured through Manufacturing Method 1 shown in FIG. 7 or Manufacturing Method 2 shown in FIG. 10. Manufacturing Method 1 may be usefully selected when an n-type III-nitride semiconductor layer is a doped n-type III-nitride semiconductor layer, and Manufacturing Method 2 may be useful when an n-type III-nitride semiconductor layer is not doped.

Manufacturing Method 1 and Manufacturing Method 2 have common processes up to a process of manufacturing a wafer (see 100h of FIGS. 1 and 100h of FIG. 10) including a plurality of LED structures from an LED wafer 100a and differ in a method of separating the formed LED structures from the wafer. Processes up to the process of manufacturing the wafer (see 100h of FIGS. 1 and 100h of FIG. 10) including the plurality of LED structures from the LED wafer 100a will be described through Manufacturing Method 1.

First, Manufacturing Method 1 will be described with reference to FIG. 7.

Manufacturing Method 1 may include operation (1) of providing an LED wafer 100a (see FIG. 7A), operation (2) of patterning an upper portion of the LED wafer 100a such that a planar surface perpendicular to a direction in which layers are stacked in each of LED structures has a desired shape and size (see FIGS. 7B and 7C), and then vertically etching a conductive semiconductor layer 10 to at least a partial thickness thereof to form the plurality of LED structures (see FIGS. 7D to 7H), operation (3) of forming a protective film so as to surround an exposed surface of each of the plurality of LED structures and expose upper surfaces of first portions between the adjacent LED structures to the outside (see FIGS. 7I and 7J), operation (4) of immersing the LED wafer in an electrolyte, electrically connecting the LED wafer to one terminal of a power supply, electrically connecting the other electrode of the power supply to an electrode immersed in the electrolyte, and then applying power to form a plurality of pores in the first portions (see FIG. 7K), and operation (5) of applying ultrasonic waves to the LED wafer to separate the plurality of LED structures from the first portions in which the plurality of pores are formed (FIG. 7O).

A wafer that is commercialized and available may be used as the LED wafer 100a provided in operation (1) without limitation. As an example, the LED wafer 100a may at least include a substrate 1, the first conductive semiconductor layer 10, a photoactive layer 20, and a second conductive semiconductor layer 30. In this case, the first conductive semiconductor layer 10 may be an n-type III-nitride semiconductor layer, and the second conductive semiconductor layer 30 may be a p-type III-nitride semiconductor layer. In addition, after the n-type III-nitride semiconductor layer is etched to a desired thickness, since the LED structures remain on the LED wafer after the etching may be separated through operations (3) to (5), a thickness of the n-type III-nitride semiconductor layer 10 in the LED wafer is also not limited, and the presence or absence of a separate sacrificial layer may not be considered when a wafer is selected.

In addition, each layer in the LED wafer 100a may have a c-plane crystal structure. In addition, the LED wafer 100a may be subjected to a cleaning process, and since a cleaning process and a cleaning solution of a typical wafer may be appropriately applied in the cleaning process, the present invention is not particularly limited thereto. The cleaning solution may be, for example, at least one selected from among isopropyl alcohol, acetone, and hydrochloric acid but is not limited thereto.

Next, before operation (2) is performed, an operation of forming the first electrode layer 40 on the p-type III-nitride semiconductor layer 30 may be performed. The first electrode layer 40 may be formed through a typical method of forming an electrode on a semiconductor layer and may be formed by, for example, deposition through sputtering. The material of the first electrode layer 40 may be, for example, ITO as described above, and the first electrode layer 40 may be formed to have a thickness of about 150 nm. The first electrode layer 40 may be further subjected to a rapid thermal annealing process after a deposition process. As an example, the first electrode layer 40 may be processed at a temperature of 600° C. for 10 minutes. However, since the rapid thermal annealing process may be appropriately adjusted in consideration of the thickness and material of the electrode layer, the present invention is not particularly limited thereto.

Next, in operation (2), the upper portion of the LED wafer may be patterned such that the planar surface perpendicular to the direction in which the layers are stacked in the individual LED structure has the desired shape and size (see FIGS. 7B and 7C). Specifically, a mask pattern layer may be formed on an upper surface of the first electrode layer 40, and the mask pattern layer may be formed using a known method and material used in etching an LED wafer. A pattern of the pattern layer may be formed by appropriately applying a typical photolithography method or nanoimprinting method.

As an example, the mask pattern layer may be a stack of a first mask layer 2, a second mask layer 3, and a resin pattern 4', which form a predetermined pattern on the first electrode layer 40 as shown in FIG. 7F. To briefly describe a method of forming the mask pattern layer, as an example, the first mask layer 2 and the second mask layer 3 may be formed on the first electrode layer 40 through deposition, a resin layer 4, from which the resin pattern layer 4' is derived, may be formed on the second mask layer 3 (see FIGS. 7B and 7C), a residual resin 4a of the resin layer 4 may be removed through a typical method such as a reactive ion etching (ME) method (see FIG. 7D), and then the second mask layer 3 and the first mask layer 2 may be sequentially etched (see FIGS. 7E and 7F) along a pattern of the resin pattern layer 4' to form the mask pattern layer. In this case, the first mask layer 2 may be made of, for example, silicon dioxide, and the second mask layer 3 may be a metal layer made of aluminum, nickel, or the like. The first mask layer 2 and the second mask layer 3 may be etched through an ME method and an inductively coupled plasma (ICP) method.

Meanwhile, when the first mask layer 2 is etched, the resin pattern layer 4' may also be removed (see 100f).

Figure 8:
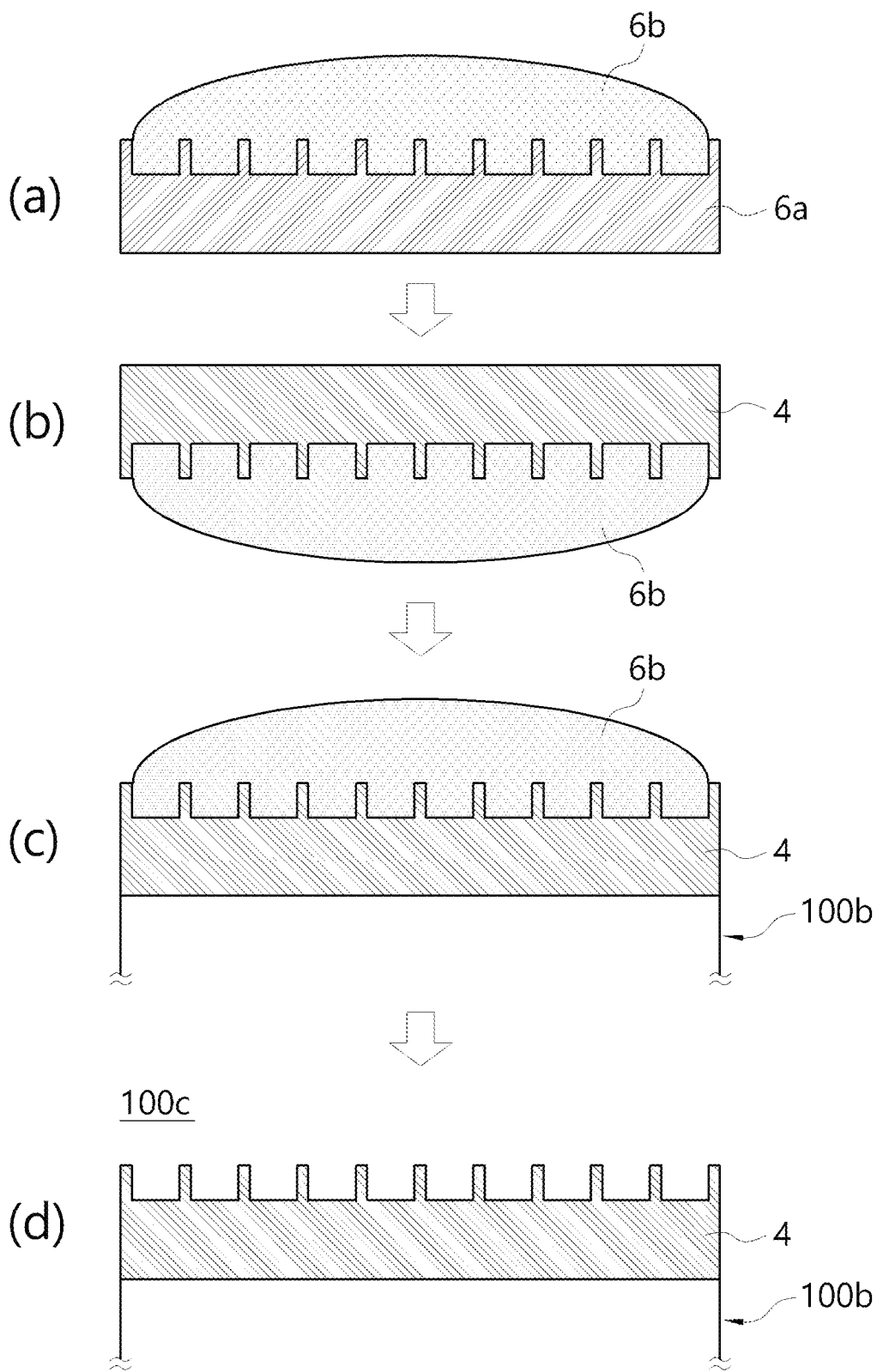
FIG. 8 shows schematic views of manufacturing processes of a resin layer included in one embodiment of the present invention.

In addition, the resin layer 4, from which the resin pattern layer 4' is derived, may be formed through a nanoimprinting method as shown in FIG. 8. After a corresponding mold 6b is manufactured on a desired predetermined pattern mold 6a (see FIG. 8A), the mold 6b may be treated with a resin to form the resin layer 4 (see FIG. 8B), the resin layer 4 may be transferred so as to be positioned on a wafer stack 100b in which the first mask layer 2 and the second mask layer 3 are formed on the first electrode layer 40, and then the mold 6b may removed to implement a wafer stack 100c on which the resin layer 4 is formed.

Meanwhile, although a method of forming a pattern through the nanoimprinting method has been described, the present invention is not limited thereto, and a pattern may also be formed through known photolithography using a photosensitive material or may be formed through known laser interference lithography, electron beam lithography, or the like.

Thereafter, as shown in FIG. 7G the first conductive semiconductor layer 10, which is an n-type III-nitride semiconductor layer, may be vertically etched to a partial thickness in a direction perpendicular to a surface of an LED wafer 100f along a pattern of the mask layers 2 and 3 formed on the first electrode layer 40, thereby forming an LED wafer 100g on which the LED structures are formed. In this case, the etching may be performed through typical dry etching such as ICP and KOH/TMAH wet etching. In such an etching process, the second mask layer 3 made of aluminum constituting the mask pattern layer may be removed, and then, the first mask layer 2, which is made of silicon dioxide constituting the mask pattern layer present on the first electrode layer 40 of each LED structure in the LED wafer 100g, may be removed to manufacture an LED wafer 100h on which the plurality of LED structures are formed.

Next, as operation (3), an operation of forming a protective film 80a to a predetermined thickness so as to surround the exposed surface of each of the plurality of LED structures in the LED wafer 100h on which the plurality of LED structures and expose upper surfaces S1 of first portions a between the adjacent LED structures to the outside is performed (see FIGS. 7I and 7J). The protective film 80a is for preventing damage to the LED structure due to the performing of operation (4) to be described below. In addition, when the protective film 80a continues to remain on a side surface of the LED structure separated from the LED wafer, the protective film 80a may also perform a function of protecting a side surface of the individually separated LED structure from external stimuli.

Figure 9:
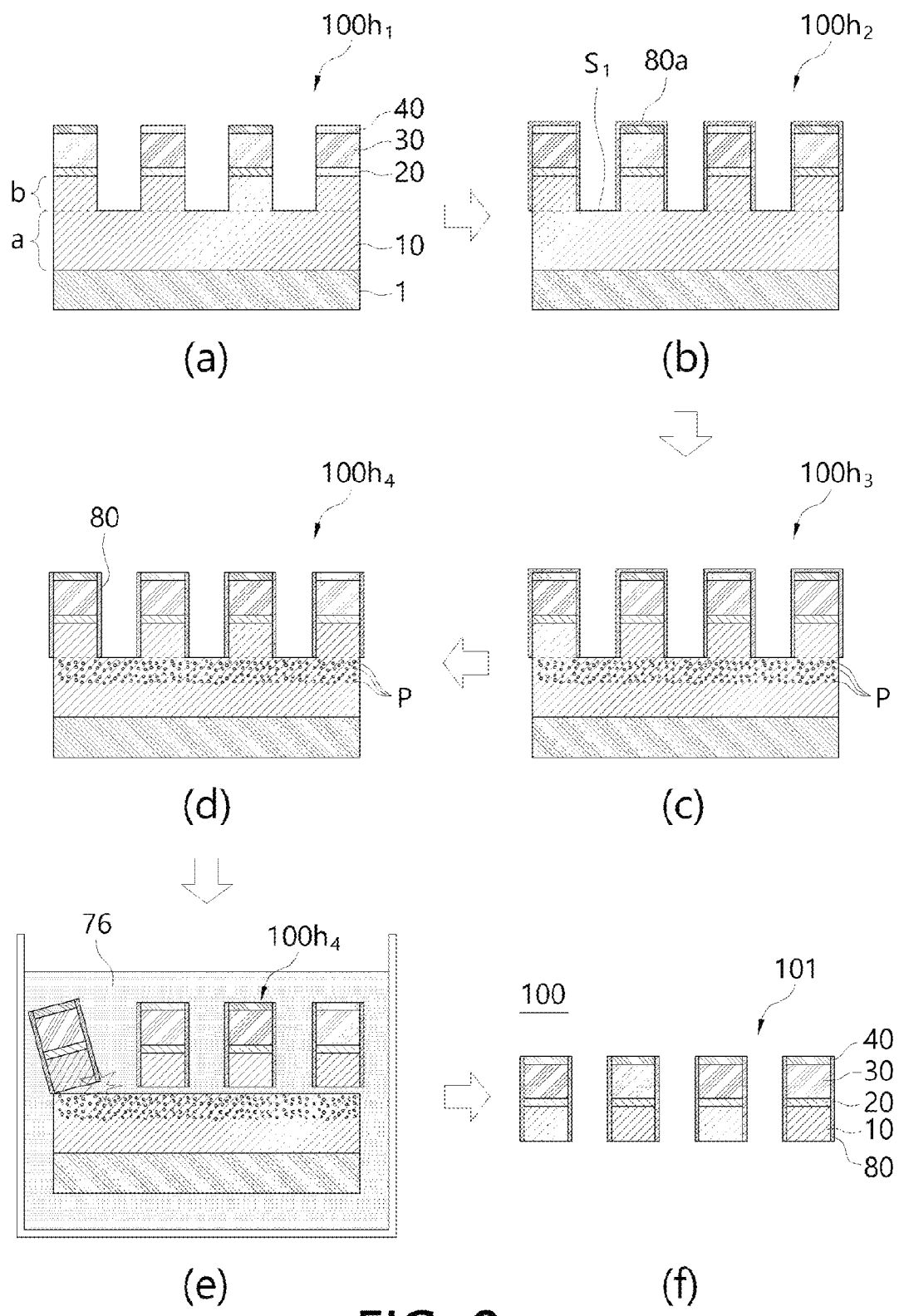
FIG. 9 shows schematic views of Manufacturing Method 1 of an ultra-thin LED element according to one embodiment of the present invention.

Describing operations (3) to (5) with reference to FIG. 9, specifically, operation (3) may be performed by depositing a protective film material on the LED wafer 100h, on which the plurality of LED structures are formed, to form the protective film 80a to a predetermined thickness so as to surround the exposed surface of each of the plurality of LED structures (operation 3-1) and removing the protective film deposited on the upper surfaces S1 of the first portions a between the adjacent LED structures to expose the upper surfaces S1 of the first portions a between the LED structures to the outside (operation 3-2).

Operation 3-1 is an operation of depositing the protective film material on the LED wafer 100h on which the plurality of LED structures are formed (see FIG. 9A). In this case, the protective film material may be a known material that is not chemically damaged by the electrolyte solution in operation (4) to be described below. As an example, the above-described material of the protective film 80 may be used without limitation, and specifically, the protective film material may include at least one selected from among silicon nitride ($Si_3N_4$), silicon dioxide ($SiO_2$), aluminum oxide ($Al_2O_3$), hafnium oxide ($HfO_2$), zirconium oxide ($ZrO_2$), yttrium oxide ($Y_2O_3$), lanthanum oxide ($La_2O_3$), scandium oxide ($Sc_2O_3$), titanium dioxide ($TiO_2$), aluminum nitride (AlN), and gallium nitride (GaN). In addition, the protective film 80a formed by depositing the protective film material may have a thickness of 5 nm to 100 nm and more preferably a thickness of 30 nm to 100 nm. When the thickness of the protective film 80a is less than 5 nm, it may be difficult to prevent the LED structure from being damaged by the electrolyte in operation (4) to be described below, and when the thickness of the protective film 80a exceeds 100 nm, there may be problems in that manufacturing costs are increased and the LED structures are connected.

Next, operation 3-2 is an operation of removing the protective film deposited on the upper surfaces S1 of the first portions a between the adjacent LED structures to expose the upper surfaces S1 of the first portions a between the LED structures to the outside (see FIG. 9B). Due to the performing of operation 3-1, the protective film material is also deposited on the upper surfaces S1 of the first portions a between the adjacent LED structures, and thus, since the electrolyte may not come into contact with the first conductive semiconductor layer 10 that is the n-type III-nitride semiconductor, desired pores may not be formed in the first portions a. Thus, an operation of removing the protective film material applied on the upper surfaces S1 of the first portions a to expose the upper surfaces S1 of the first portions a to the outside may be performed, and in this case, the removing of the protective film material may be performed through a known dry or wet etching method in consideration of the protective film material.

Meanwhile, according to one embodiment of the present invention, the protective film 80a formed in operation (3) may be a temporary protective film for preventing damage to the LED structure due to the performing of operation (3), and after the temporary protective film is removed, an operation of forming a surface protective film surrounding the side surface of the LED structure may be further included between operation (4) and operation (5). That is, as shown in FIG. 7, a protective film 5' in operation (3) may be provided only as a temporary protective film for preventing damage to the LED structure in operation (4) (see FIGS. 7I to 7K), and a surface protective film 80, which performs a function of preventing damage to the surface of the LED structure after the temporary protective film is removed, may be formed to cover the side surface of the LED structure before operation (5) is performed (see FIG. 7M).

Meanwhile, in some embodiments as shown in FIG. 7, there is inconvenience in that the protective film is formed twice, but the protective film may be selected in consideration of the planar shape and size of the LED structures to be manufactured, and the interval between the LED structures. In addition, when operation (4) to be described below is performed, a protection film may be partially damaged, and since there may be a case in which, when the damaged protection film is left on the finally obtained individual LED structure and used as a surface protective film, it is difficult for the damaged protection film to properly perform a surface protection function, in some cases, it may be advantageous to remove a protective film subjected to operation (4) and then provide a protective film again.

Describing such manufacturing processes shown in FIG. 7, after a temporary protective film material 5 is deposited on the LED wafer 100h on which the plurality of LED structures are formed (see FIG. 7I), the temporary protective film material 5, which is deposited on the upper surfaces 51 of the first portions a of the doped n-type III-nitride semiconductor layer 10 between adjacent LEDs of an LED wafer 100$i$ on which the protective film 5 is deposited, may be etched to form the protective film 5' which is a temporary protective film that protects the side surfaces and upper portions of the plurality of LED structures. Next, after operation (4) to be described below is performed (see FIG. 7K), the protective film 5' may be removed through etching (see FIG. 7L), a protective film material may be deposited on the LED wafer 100$l$ as a surface protective film for protecting the surface of the LED structure, and then, the protective film material formed on each of the LED structures may be removed to form the protective film 80 surrounding the side surface of the LED structure (see FIG. 7M). In this case, the protective film material formed on the LED structures may be removed together with the protective film material deposited on the upper surfaces 51 of the first portions (a) of the doped n-type III-nitride semiconductor layer 10 between adjacent LED structures of an LED wafer 100$m$. Thus, in operation (5) to be described below, a bubble-forming solution may come into contact with the upper surfaces 51 of the first portions a, and bubbles generated through ultrasonic waves may penetrate into pores P formed in the first portions a so that the LED structures may be separated through the bubbles.

Meanwhile, descriptions of the temporary protective film material and the surface protective film material are the same as those of the material of the above-described protective film, and an implemented film thickness may also be implemented within a thickness range of the above-described protective film.

Next, as operation (4) of Manufacturing Method 1, an operation of immersing the LED wafer in the electrolyte, electrically connecting the LED wafer to one terminal of the power supply, electrically connecting the other electrode of the power supply to the electrode immersed in the electrolyte, and then applying power to form the plurality of pores in the first portions is performed.

Specifically, referring to FIG. 9, an LED wafer 100$h_2$ on which the protective film 80$a$ is formed may be electrically connected to one terminal of the power supply, for example, an anode, and the other terminal of the power supply, for example, a cathode, may be electrically connected to the electrode immersed in the electrolyte, for example, a cathode, and then, power may be applied, thereby manufacturing an LED wafer 100$h_3$ in which the plurality of pores P are formed in the first portions a of the first conductive semiconductor layer 10 which is a doped n-type III-nitride semiconductor. In this case, the pores P may start to be formed from the upper surface 51 of the first portions (a) of the first conductive semiconductor layer 10, which is the doped n-type III-nitride semiconductor, in direct contact with the electrolyte, and may be formed in a thickness direction and a direction toward a side surface of the first portion (a) corresponding to a lower portion of each of the LED structures.

The electrolyte used in operation (4) may include at least one oxygen acid selected from the group consisting of an oxalic acid, a phosphoric acid, a sulfurous acid, a sulfuric acid, a carbonic acid, an acetic acid, a chlorous acid, a chloric acid, a bromic acid, a nitrous acid, and a nitric acid, and more preferably, oxalic acid may be used. Therefore, there is an advantage in that damage to the first conductive semiconductor layer can be minimized. In addition, the electrode may be made of platinum (Pt), carbon (C), nickel (Ni), gold (Au), or the like and may be, for example, a platinum electrode. In addition, in operation (4), a voltage of 3 V or more may be applied as power for one minute to 24 hours, and thus, the pores P can be smoothly formed up to the first portion (a) corresponding to the lower portion of each of the plurality of LED structures. Accordingly, the LED structure can be more easily separated from the wafer through operation (4). More preferably, a voltage of 10 V or more may be applied, and more preferably, a voltage of 30 V or less may be applied. When a voltage of less than 3 V is applied, even when an application time of power is increased, pores may not smoothly formed in the first portion (a) corresponding to the lower portion of each of the LED structures, and thus, it may be difficult to separate the LED structures through operation (5) to be described below, or even though the LED structures are separated, separated one cross sections of the plurality of LED structures may have different shapes, which may make it difficult for the plurality of LED structures to exhibit uniform characteristics. In addition, when a voltage exceeding 30 V is applied, pores may be formed up to a second portion b which is a lower end portion of the LED structure connected to the first portion (a) of the doped n-type III-nitride semiconductor layer, thereby causing the deterioration of luminescent properties. In addition, it is preferable that the separation of the LED structure in operation (5) to be described below is performed at a boundary point between the first portion (a) of the doped n-type III-nitride semiconductor layer and the second portion b, but due to pores formed in the second portion b, separation may occur at any point of the second portion b beyond the boundary point, which may cause a risk of obtaining an LED structure including an n-type semiconductor layer with a thickness less than that of an initially designed n-type semiconductor layer. In addition, similarly to an effect according to a strength of a voltage, when an application time of power is increased, pores are likely to be formed in the second portion b other than a desired portion, and on the contrary, when the application time is decreased, pores may not be smoothly formed, and thus, it may be difficult to separate the LED structures.

After operation (4) and before operation (5) to be described below, an operation of manufacturing an LED wafer 100$h_4$, in which the protective film formed on an upper surface of each of the LED structures among the protective films 80$a$ is removed to enable an electrical connection toward the first electrode layer 40 after the LED structure is separated from a wafer, may be further performed. In addition, since only the protective film formed on the upper surface of the LED structure is removed, the protective film 80 formed on the side surface of the LED structure may remain to perform a function of protecting the side surface of the LED structure from the outside.

In addition, after operation (4) and before operation (5) to be described below, an operation of forming another layer on the first electrode layer 40 of the LED structure may be further performed, and the another layer may be, for example, a Ti/Au composite layer that may be further formed on the first electrode layer 40, which is an ITO layer, with a first electrode layer material, or the selective bonding layer 70 (see FIG. 7N).

Next, as operation (5) according to Manufacturing Method 1, an operation of applying ultrasonic waves to the LED wafer to separate the plurality of LED structures from the first portions (a) in which the plurality of pores P are formed is performed.

In this case, the ultrasonic wave may be applied directly to the LED wafer 100$h_4$ in which pores are formed or may be applied indirectly by immersing the LED wafer 100$h_4$, in which the pores are formed, in a solvent. However, in a method of collapsing the pores P of the first portion (a) using a physical external force caused by the ultrasonic wave itself, the collapse of the pores is not smooth, and when the pores are excessively formed to facilitate the collapse, the pores are likely to be formed up to the second portion b of the LED structure, which may cause a side effect of reducing the quality of the LED structure.

Accordingly, according to one embodiment of the present invention, operation (5) may be performed using a sonochemical method. Specifically, after the LED wafer $100h_4$ is immersed in a bubble-forming solution (or solvent) 76, ultrasonic waves are applied to the bubble-forming solution (or solvent) 76 to collapse the pores through energy generated when bubbles generated and grown through a sonochemical mechanism burst in the pores, thereby separating the plurality of LED structures. Specifically, ultrasonic waves alternately generate a relatively high pressure portion and a relatively low pressure portion in a traveling direction of a sound wave. In this case, generated bubbles pass through the high pressure portion and the low pressure portion and repeatedly contract and expand to grow into bubbles with a higher temperature and high pressure and then collapse, and when the bubbles collapse, as an example, the bubbles become local hot spots that generate a high temperature of 4,000 K and a high pressure of 1,000 atmospheric pressure. Therefore, by using such energy, the pores generated in the LED wafer may be collapsed to separate the LED structure from the wafer. After all, the ultrasonic wave only performs a function of generating and growing bubbles in the bubble-forming solution (or solvent) and moving and allowing the generated bubbles to penetrate into the pores P of the first portion (a). Then, through a pore collapse mechanism in which the pores P are collapsed by an external force generated at the time of the bursting of the bubbles in an unstable state with a high temperature and high pressure, which have penetrated into the pores P, the plurality of LED structures may be easily separated from the LED wafer, thereby obtaining an ultra-thin LED aggregate 100' including a plurality of ultra-thin LED elements 101'.

A solution (or solvent) capable of generating bubbles when ultrasonic waves are applied and growing to have high pressure and temperature may be used as the bubble-forming solution (or solvent) 76 without limitation, and preferably, the bubble-forming solution (or solvent) may have a vapor pressure of 100 mmHg or less (at 20° C.), for example, a vapor pressure of 80 mmHg or less (at 20° C.), a vapor pressure of 60 mmHg or less (at 20° C.), a vapor pressure of 50 mmHg or less (at 20° C.), a vapor pressure of 40 mmHg or less (at 20° C.), a vapor pressure of 30 mmHg or less (at 20° C.), a vapor pressure of 20 mmHg or less (at 20° C.), or a vapor pressure of 10 mmHg or less (at 20° C.). When a solvent having a vapor pressure exceeding 100 mmHg (at 20° C.) is used, separation may not occur properly within a short time, and thus there is a risk of a manufacturing time being increased and production costs being increased. The bubble-forming solution (or solvent) 76 satisfying such physical properties may include, for example, at least one selected from the group consisting of gamma-butyllactone, propylene glycol methyl ether acetate, methyl pyrrolidone, and 2-methoxyethanol. Meanwhile, a solution (or solvent) having a vapor pressure of 100 mmHg at room temperature, for example, 20° C., may be used as the bubble-forming solution (or solvent), but alternatively, by adjusting conditions for performing operation (5), operation (5) may be performed by adjusting a vapor pressure of the bubble-forming solution (or solvent) so as to be 100 mmHg or less under the above conditions (for example, low temperature conditions). In this case, restrictions on types of usable solvents may be wider, and as an example, solvents such as water, acetone, chloroform, and alcohols may be used.

In addition, a wavelength of an ultrasonic wave applied in operation (5) may be in a range capable of causing a sonochemical effect, and specifically, the ultrasonic wave may be applied at a frequency capable of growing and collapsing bubbles so as to become local hot spots that generate high pressure and temperature when collapsed. As an example, the frequency may be in a range of 10 kHz to 2 MHz, and an application time of the applied ultrasonic wave may be in a range of 1 minute to 24 hours, thereby making it easy to separate the LED structure from the LED wafer. Even when a wavelength of an applied ultrasonic wave falls within the range, when an intensity of the applied ultrasonic wave is low or an application time thereof is short, there is a risk that there are LED structures that are not separated from the LED wafer or that the number of the LED structures that are not separated from the LED wafer is increased. In addition, when the intensity of the applied ultrasonic wave is high or the application time is long, the LED structure may be damaged.

Meanwhile, in order to form a second electrode layer 60 on the first conductive semiconductor layer 10, before operation (5) is performed, an operation of attaching a support film 9 onto an LED wafer 100n to form another layer, for example, the second electrode layer 60 or an electron delay layer (not shown) on the first conductive semiconductor layer 10 may be further performed (see FIG. 7O), and then, operation (5) may be performed to separate the plurality of LED structures in a state in which the support film 9 is attached (see FIG. 7P). After that, in a state in which the support film 9 is attached, the second electrode layer 60 may be formed on the plurality of LED structures through a known method such as a deposition method (FIG. 7Q), and then, the support film may be removed, thereby obtaining an aggregate 100 of a plurality of ultra-thin LED elements 101.

Next, a method of manufacturing an ultra-thin LED element through Manufacturing Method 2 will be described with reference to FIG. 10.

As described above, an LED wafer 100h, on which a plurality of LED structures are formed, being formed from an LED wafer is the same as in Manufacturing Method 1. Thereafter, the LED wafer 100h on which the plurality of LED structures are formed may be processed by operation (i) of forming an insulating film 8 so as to cover exposed side surfaces of the plurality of LED structures (see FIG. 10B), operation (ii) of removing portions of the insulating film formed on a first conductive semiconductor layer 10 to expose upper surfaces S1 of the first conductive semiconductor layer 10 between adjacent LED structures (see FIG. 10C), operation iii) of further etching the first conductive semiconductor layer 10 in a thickness direction thereof through the exposed upper surfaces S1 of the first conductive semiconductor layer to form portions of the first conductive semiconductor layer, of which a side surface is exposed by a predetermined thickness in a downward direction of the first conductive semiconductor layer of a micronanofin LED pillar, on which an insulating film 8' is formed (see FIG. 10C), operation (iv) of etching the portions of the first conductive semiconductor layer, of which the side surface is exposed, in a direction from both side surfaces to a center thereof (see FIG. 10D), operation (v) of removing the insulating film 8 (see FIG. 10E), operation (vi) of forming a protective film 80 on side surfaces of the plurality of LED structures (see of FIG. 10F), operation (vii) of removing the protective film formed on the plurality of LED structures to expose a first electrode layer 40 (see FIG. 10G), operation (viii) of forming a selective bonding layer 70 on the first electrode layer 40 (see FIG. 10H), and operation (ix) of separating the plurality of LED structures from the LED wafer, thereby manufacturing an ultra-thin LED aggregate 100' including a plurality of ultra-thin LED elements 101'. Meanwhile, Manufacturing Method 2 may be performed by appropriately using a known method of manufacturing an LED element, and for detailed descriptions thereof, Korean Patent Application No. 2020-0050884 by the inventors of the present invention is incorporated by reference in its entirety. Detailed descriptions of each operation of Manufacturing Method 2 of the present invention will be omitted.

In this case, the separating of the plurality of LED structures in operation (ix) may be performed by cutting using a cutting mechanism or detaching using an adhesive film.

Figure 11:
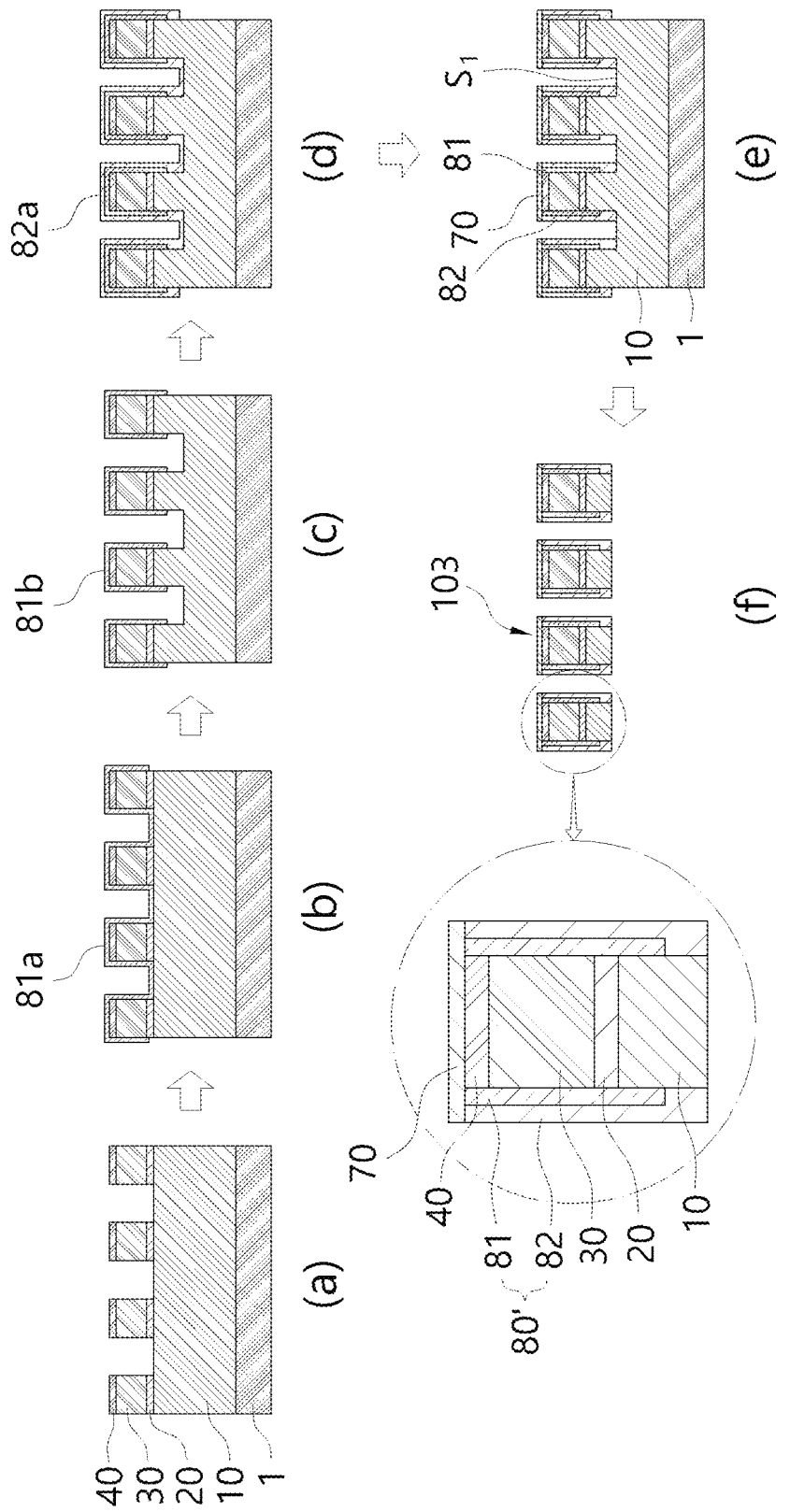
FIG. 11 shows schematic views of a manufacturing method of an ultra-thin LED element according to one embodiment of the present invention.

Meanwhile, as described above with reference to FIG. 6, a protective film 80' including a hole pushing film 81 and an electron pushing film 82 for improving luminous efficiency as a protective film may be formed, and a manufacturing method thereof will be described with reference to FIG. 11.

There is a difference from those described above with reference to FIGS. 7, 9 and 10 in that processes of, during vertical etching, without performing etching down to a portion of a first conductive semiconductor layer 10 which is an n-type semiconductor, primarily etching only a second conductive semiconductor layer 30 or only a portion or entirety of the second conductive semiconductor layer 30 and a photoactive layer 20 (see FIG. 11A), secondarily etching the first conductive semiconductor layer 10 to a partial thickness thereof (see FIG. 11C), depositing a film material, and removing the film material between a plurality of LED structures are performed twice (see FIGS. 11B, 11D, and 11E).

Specifically, processes of, when an LED wafer is vertically etched, without performing etching down to a portion of the first conductive semiconductor layer 10 which is the n-type semiconductor, primarily etching only the second conductive semiconductor layer 30 or only a portion or an entirety of the second conductive semiconductor layer 30 and the photoactive layer 20 (see FIG. 11A), depositing a hole pushing film material 81a (see FIG. 11B), and then, removing a hole-repellent material formed between the LED structures are performed. After that, process of secondarily etching the first conductive semiconductor layer 10 again to a predetermined thickness thereof (see FIG. 11C), depositing an electron pushing film material 82a on the LED structure on which a hole pushing film 81b is formed (see FIG. 11D), and then, removing an electron-repellent material formed on an upper surface 51 between the LED structures again (FIG. 11E) may be performed. Thereafter, a process of separating the LED structure as described above with reference to FIGS. 7 and 9 (see FIG. 7K and the drawings subsequent thereto and see FIG. 9D and the drawings subsequent thereto), or a process of separating the LED structure in FIG. 10 (see FIG. 10D and the drawings subsequent thereto) may be performed to separate an ultra-thin LED element 103 from the LED wafer.

The ultra-thin LED elements 101, 102, and 103 obtained through the above-described methods may be implemented with an ink composition for inkjet. The ink composition may further include a dispersion medium and other additives which are provided in a known ink composition for inkjet, and the present invention is not particularly limited thereto.

In addition, according to the present invention, a light source including the ultra-thin LED element 101, 102, or 103 described above is included. The light source may include, for example, various LED lights for home/vehicle, displays, medical devices, beauty devices, optical devices, or one component constituting the same.

The present invention will be described in more detail through the following Examples, but the following Examples do not limit the scope of the present invention, and it should be understood that the following Examples are intended to assist the understanding of the present invention.

EXAMPLE 1

Figure 12:
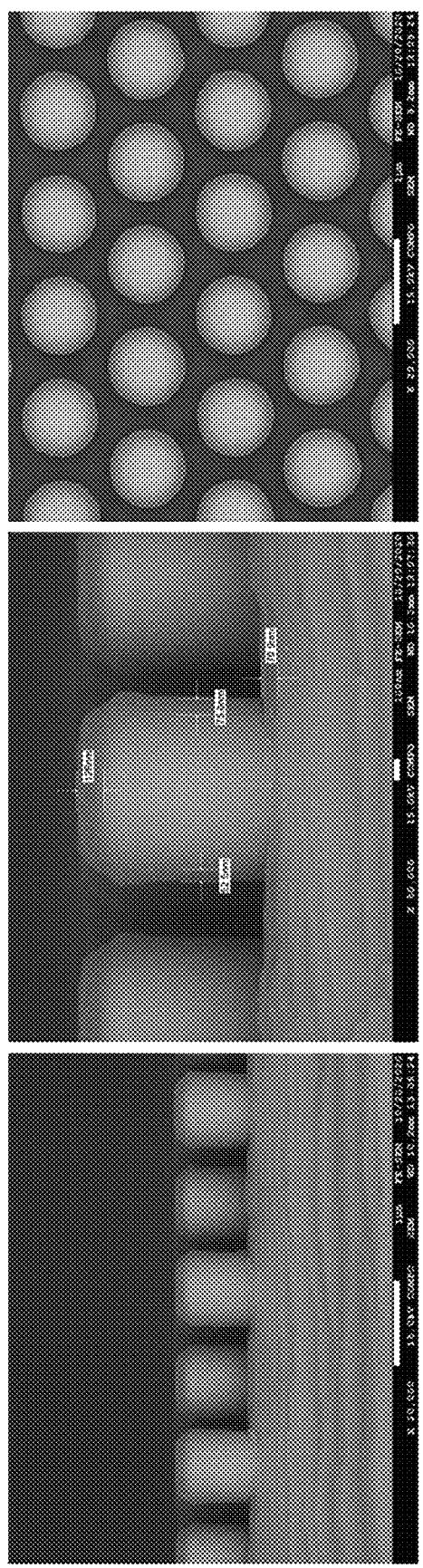
FIGS. 12 and 13 show scanning electron microscope (SEM) images in a specific operation of a manufacturing method of an ultra-thin LED element according to one embodiment of the present invention.

A typical LED wafer (manufactured by Epistar Corporation), in which an undoped n-type III-nitride semiconductor layer, an n-type III-nitride semiconductor layer doped with Si (with a thickness of 4 μm), a photoactive layer (with a thickness of 0.45 μm), and a p-type III-nitride semiconductor layer (with a thickness of 0.05 μm) were sequentially stacked on a substrate, was provided. ITO (with a thickness of 0.15 μm as a first electrode layer, $SiO_2$ (with a thickness of 1.2 μm) as a first mask layer, and Al (with a thickness of 0.2 μm) as a second mask layer were sequentially deposited on the provided LED wafer, and then a spin-on-glass (SOG) resin layer onto which a pattern is transferred was transferred onto the second mask layer using nanoimprint equipment. Thereafter, the SOG resin layer was cured using ME, and a residual resin portion of the resin layer was etched through RIE to form a resin pattern layer. After that, a second mask layer was etched using ICP according to the pattern, and a first mask layer was etched using ME. Next, after the first electrode layer, the p-type III-nitride semiconductor layer, and the photoactive layer were etched using ICP, the doped n-type III-nitride semiconductor layer was etched to a thickness of 0.78 μm, and then, an LED wafer, in which a plurality of LED structures (with a diameter of 850 nm and a height of 850 nm) were formed through KOH wet etching so as to implement a side surface of the etched doped n-type III-nitride semiconductor layer so as to be perpendicular to a layer surface, was manufactured. After that, a $SiN_x$ protective film material was deposited on the LED wafer on which the plurality of LED structures were formed (deposition thicknesses of 52.5 nm and 72.5 nm from a side surface of the LED structure, see a scanning electron microscope (SEM) image of FIG. 12), and then, the protective film material formed between the plurality of LED structures was removed through a reactive ion etcher to expose an upper surface S1 of a first portion (a) of the doped n-type III-nitride semiconductor layer.

Figure 13:
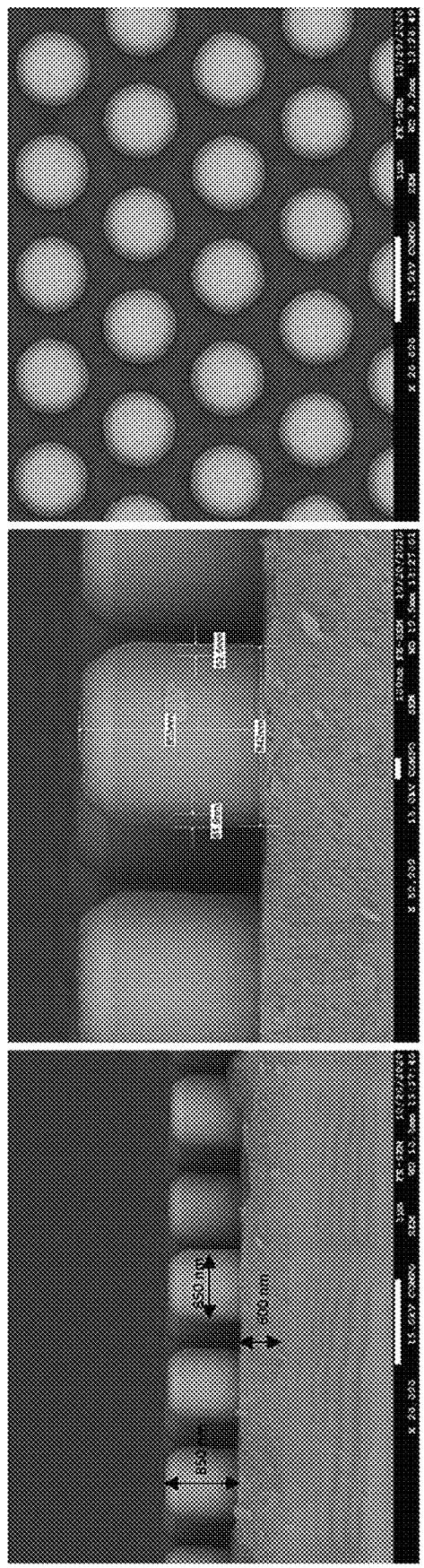
Figure 14:
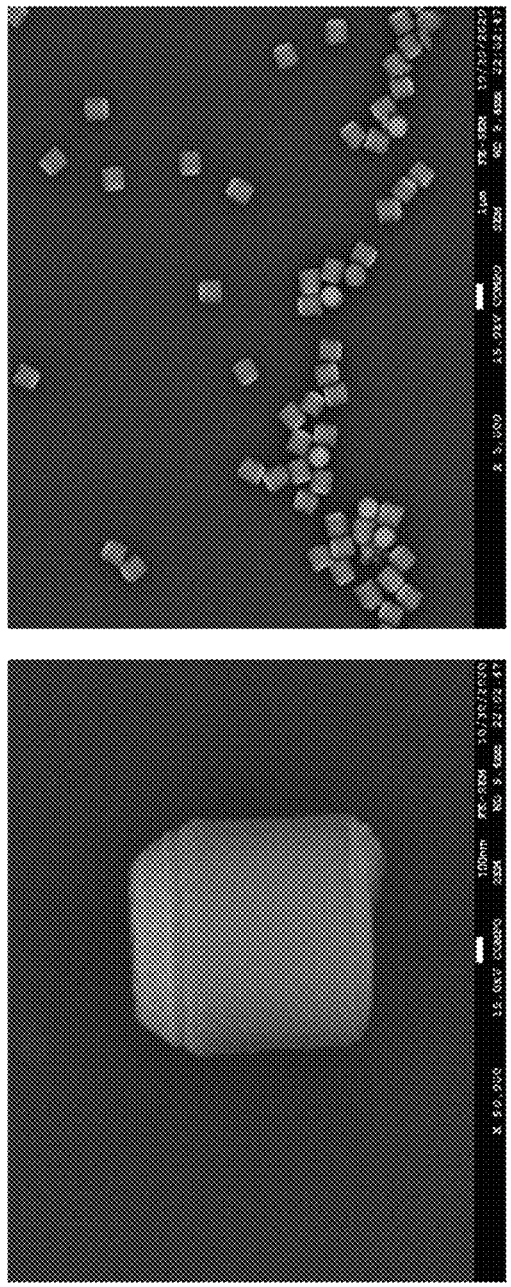
FIG. 14 shows SEM images of an ultra-thin LED element obtained through a manufacturing method of an ultra-thin LED element according to one embodiment of the present invention.
Figure 15:
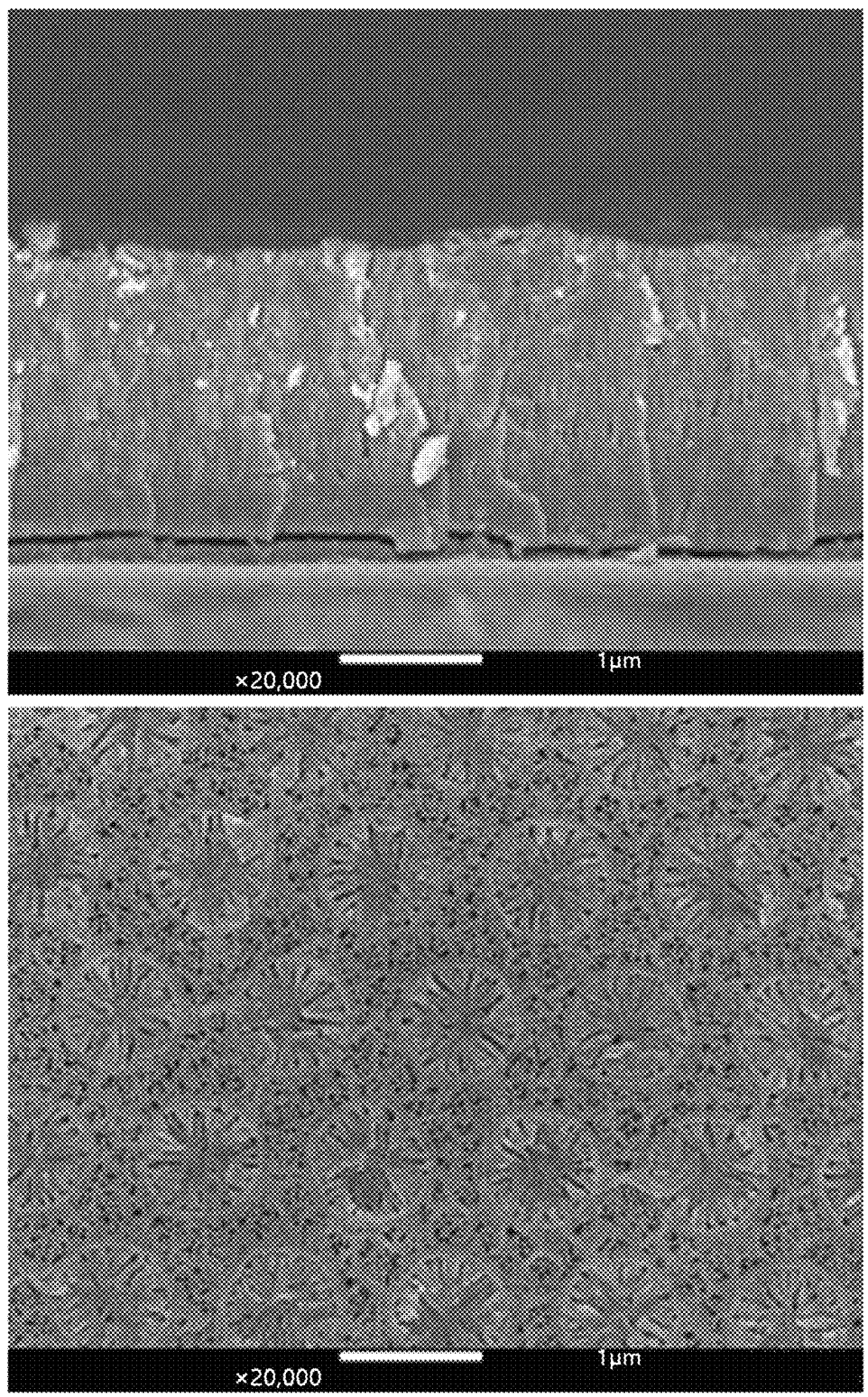
FIG. 15 shows SEM images of an LED wafer remaining after an ultra-thin LED element is manufactured through a manufacturing method of an ultra-thin LED element according to one embodiment of the present invention.

Then, the LED wafer on which a temporary protective film was formed was immersed in an electrolyte solution of 0.3M oxalic acid and connected to an anode terminal of a power supply, a cathode terminal was connected to a platinum electrode immersed in the electrolyte, and then, a voltage of 10 V was applied for 5 minutes to form a plurality of pores from the surface of the first portion (a) of the doped n-type III-nitride semiconductor layer to a depth of 600 nm as shown in a SEM image of FIG. 13. Next, after the temporary protective film was removed through RIE, a surface protective film made of $Al_2O_3$ was deposited again on the LED wafer to a thickness of 50 nm from the side surface of the LED structure, the surface protective film formed on the plurality of LED structures and the surface protective film formed on the upper surface S1 of the first portion (a) of the doped n-type III-nitride semiconductor layer were removed through ICP to expose the upper surface S1 of the first portion (a) of the semiconductor layer and an upper surface of the LED structure. Next, after the LED wafer was immersed in a bubble-forming solution of gamma-butyllactone, ultrasonic waves were radiated at a frequency of 40 kHz for 10 minutes to collapse the pores formed in the doped n-type III-nitride semiconductor layer using generated bubbles and separate the plurality of LED structures from the wafer as shown in a SEM image of FIG. 14, thereby manufacturing an ultra-thin LED element aggregate including ultra-thin LED elements. In addition, as shown in FIG. 15, it can be confirmed that there is no LED structure that is not separated from the wafer.

COMPARATIVE EXAMPLE 1

A rod-type LED element aggregate having the same stacked structure as in Example 1 having a diameter of 650 nm and a height of 4.2 μm was manufactured from an LED wafer through a typical method.

EXPERIMENTAL EXAMPLE 1

Figure 16:
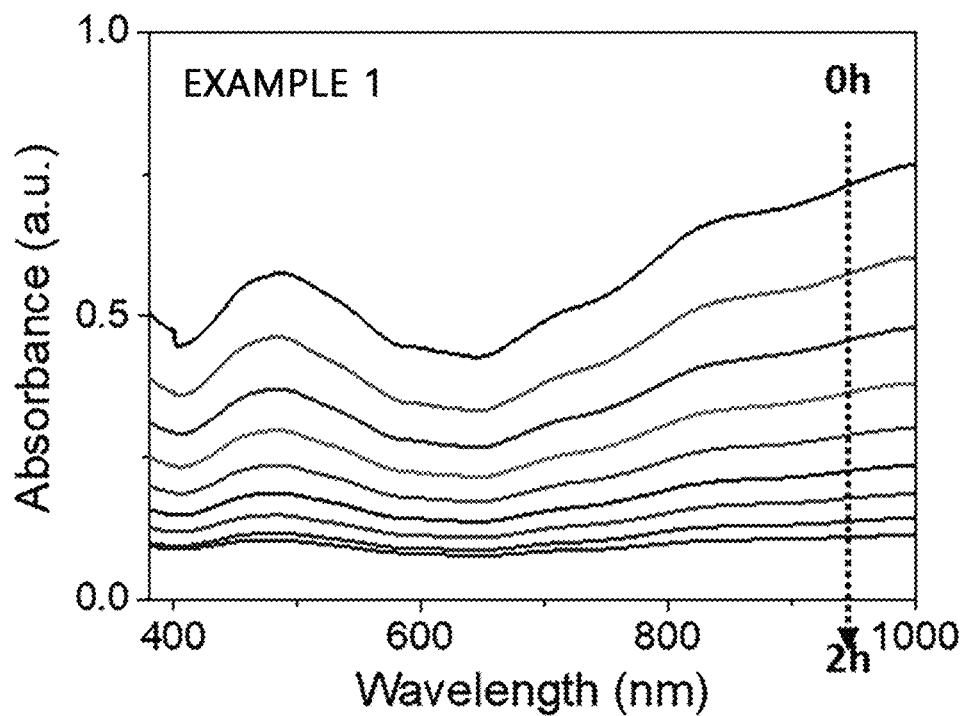
FIGS. 16 and 17 are graphs of absorbance for each wavelength measured for each time after LED element aggregates according to Example 1 and Comparative Example 1 are dispersed in acetone.
Figure 17:
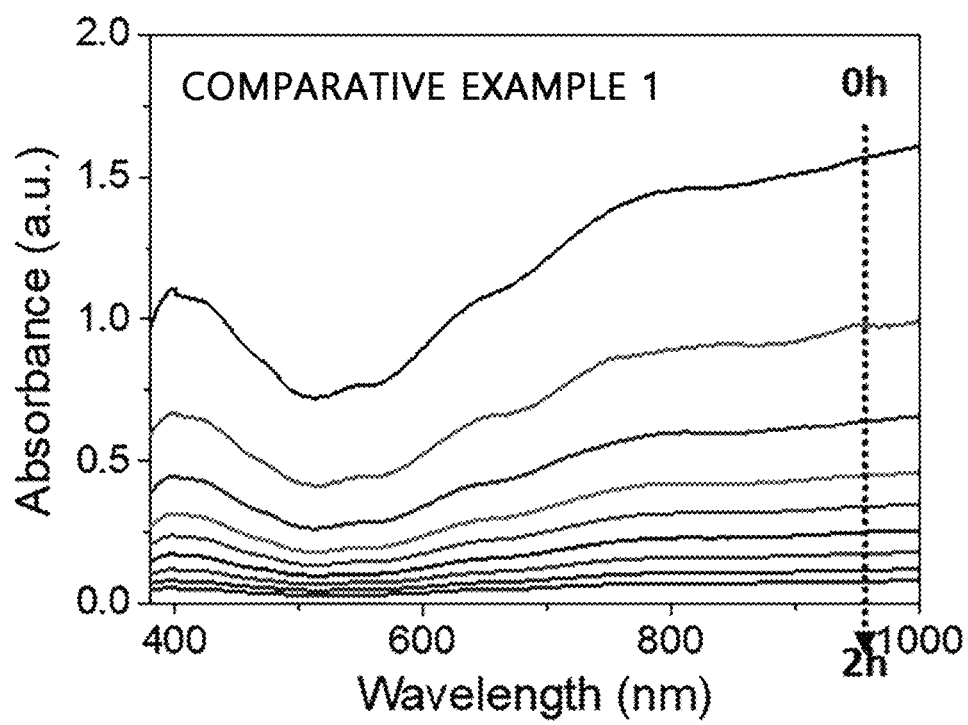

After each of the LED elements aggregates manufactured in Example 1 and Comparative Example 1 was put into acetone, ultrasonic waves were radiated under a condition of 100 W to disperse the LED elements aggregates, and then, absorbance was measured for 2 hours at 15-minute intervals to check a dispersed state of LED elements. An absorbance graph for each measurement time of the ultra-thin LED element aggregate according to Example 1 is shown in FIG. 16, and an absorbance graph for each measurement time of the rod-type LED element aggregate according to Comparative Example 1 is shown in FIG. 17. Among measurement results, a spectral area of a visible light region of 380 nm to 780 nm is normalized, and an absorbance graph for each time is shown in FIG. 18.

Figure 18:
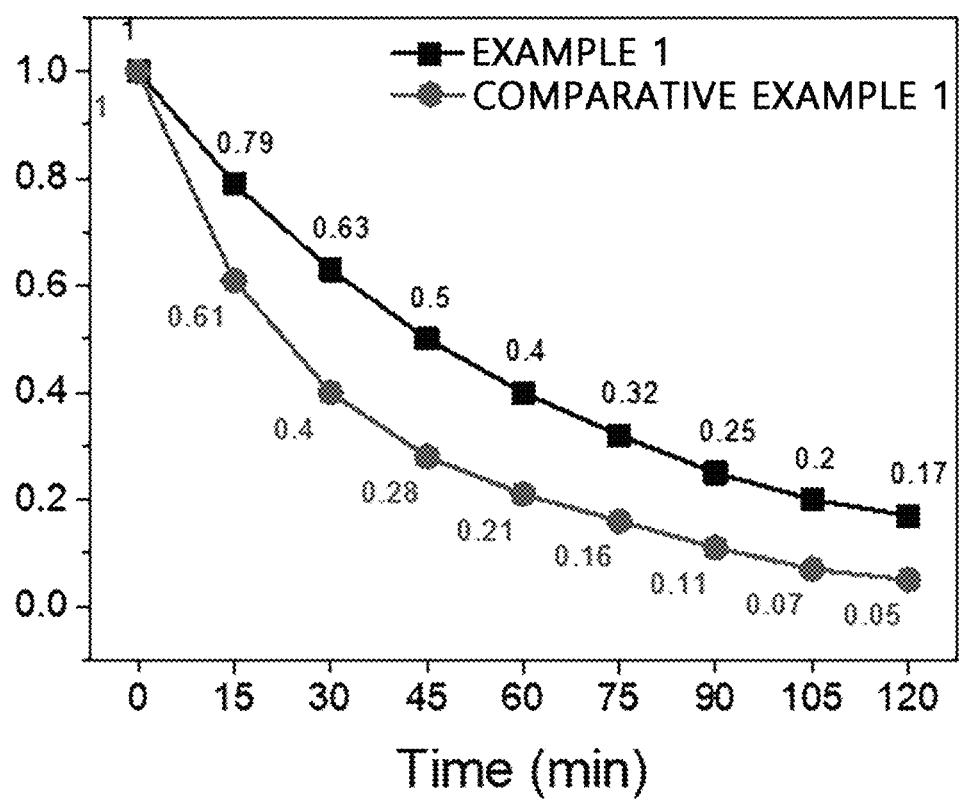
FIG. 18 is a graph of dispersion retention (DR) performance for each time calculated using absorbance measured for each time after the LED element aggregates according to Example 1 and Comparative Example 1 are dispersed in acetone.

As can be confirmed from FIG. 18, it can be seen that the ultra-thin LED element according to Example 1 has excellent dispersion retention performance in an acetone solvent for a long time as compared with the rod-type LED element according to Comparative Example 1.

An ultra-thin LED element according to the present invention is advantageous in achieving high luminance and luminous efficiency by increasing an emission area as compared with a conventional rod-type LED element. In addition, an emission area is increased, and also, an area of an exposed surface of a photoactive layer is greatly reduced, thereby preventing or minimizing a decrease in efficiency due to surface defects. Furthermore, it is possible to minimize a decrease in electron-hole recombination efficiency due to non-uniformity of electron and hole velocities and a decrease in luminous efficiency due to the decrease in electron-hole recombination efficiency. In addition, since the LED element has excellent dispersion retention performance in a solvent without additives such as a separate dispersant, the LED element is suitable to be implemented with inkjet ink, thereby being widely applied as a material for various light sources such as displays.

While the embodiments of the present invention have been described above, the present invention is not limited to the embodiment presented herein. One skilled in the art may easily suggest other embodiments due to addition, modification, deletion, and the like of components within the scope and spirit of the present invention, and the addition, modification, deletion, and the like of the components fall within the scope and spirit of the present invention.

What is claimed is:

1. An ultra-thin light-emitting diode (LED) element at least comprising:
   a first conductive semiconductor layer;
   a photoactive layer;
   a second conductive semiconductor layer; and
   a selective bonding layer configured to erect and assemble the ultra-thin LED element in a thickness direction thereof at a desired position of a driving electrode on an uppermost layer or a lowermost layer of the ultra-thin LED element, wherein the selective bonding layer is a magnetic layer or a chemical bond inducing layer,
   wherein a ratio between a thickness in a stack direction of layers and a length of a major axis in a cross section perpendicular to the stack direction is in a range of 1:0.5 to 1:1.5.

2. The ultra-thin LED element of claim 1, wherein:
   one of the first conductive semiconductor layer and the second conductive semiconductor layer is an n-type III-nitride semiconductor layer; and
   the other one thereof is a p-type III-nitride semiconductor layer.

3. The ultra-thin LED element of claim 1, wherein the ultra-thin LED element has a maximum surface area of 16 μm$^2$ or less, wherein the maximum surface area refers to a maximum value among areas of a vertical projection surface for the ultra-thin LED element.

4. The ultra-thin LED element of claim 1, wherein the ultra-thin LED element has a thickness of 2.7 μm or less.

5. The ultra-thin LED element of claim 1, wherein:
   the first conductive semiconductor layer is an n-type III-nitride semiconductor layer; and
   the ultra-thin LED element further includes an electron delay layer below the first conductive semiconductor layer such that the numbers of electrons and holes recombined in the photoactive layer are balanced.

6. The ultra-thin LED element of claim 5, wherein the electron delay layer includes at least one selected from the group consisting of CdS, GaS, ZnS, CdSe, CaSe, ZnSe, CdTe, GaTe, SiC, ZnO, ZnMgO, SnO$_2$, TiO$_2$, In$_2$O$_3$, Ga$_2$O$_3$, silicon (Si), polyparaphenylene vinylene, derivatives thereof, polyaniline, poly(3-alkylthiophene), and poly(paraphenylene).

7. The LED element of claim 5, wherein:
   the first conductive semiconductor layer is a doped n-type III-nitride semiconductor layer; and
   the electron delay layer is a III-nitride semiconductor having a lower doping concentration than the first conductive semiconductor layer.

8. The ultra-thin LED element of claim 1, further comprising a protective film configured to surround an exposed side surface of the ultra-thin LED element.

9. The ultra-thin LED element of claim 1, wherein:
   the first conductive semiconductor layer is an n-type III-nitride semiconductor layer;
   the second conductive semiconductor layer is a p-type III-nitride semiconductor layer; and
   the ultra-thin LED element further includes at least any one film of a hole pushing film configured to surround an exposed side surface of the second conductive semiconductor layer or the exposed side surface of the second conductive semiconductor layer and an exposed side surface of at least a portion of the photoactive layer and move holes at a surface side of the exposed side surface toward a center, and an electron pushing film configured to surround an exposed side surface of the first conductive semiconductor layer and move electrons at a surface side of the exposed side surface toward a center.

10. The ultra-thin LED element of claim 9, comprising both the hole pushing film and the electron pushing film, wherein the electron pushing film is provided as an outermost film configured to surround side surfaces of the first conductive semiconductor layer, the photoactive layer, and the second conductive semiconductor layer.

11. The ultra-thin LED element of claim 9, wherein the hole pushing film includes at least one selected from the group consisting of $AlN_x$, $ZrO_2$, $MoO$, $Sc_2O_3$, $La_2O_3$, $MgO$, $Y_2O_3$, $Al_2O_3$, $Ga_2O_3$, $TiO_2$, $ZnS$, $Ta_2O_5$, and $n\text{-}MoS_2$.

12. The ultra-thin LED element of claim 9, wherein the electron pushing film includes at least one selected from the group consisting of $Al_2O_3$, $HfO_2$, $SiN_x$, $SiO_2$, $ZrO_2$, $Sc_2O_3$, $AlN_x$, and $Ga_2O_3$.

13. The ultra-thin LED element of claim 1, further comprising a second electrode layer provided on the first conductive semiconductor layer and a first electrode layer provided on the second conductive semiconductor layer.

14. An ink composition for inkjet, comprising a plurality of ultra-thin LED elements identical to the ultra-thin LED element of claim 1.

15. A light source that is equipped with the ultra-thin LED element of claim 1.

* * * * *